(12) United States Patent
Whitmore et al.

(10) Patent No.: US 9,791,113 B2
(45) Date of Patent: Oct. 17, 2017

(54) LIGHT SOURCE ASSEMBLY WITH MULTIPLE, DISPARATE LIGHT SOURCES

(71) Applicant: Daylight Solutions Inc., San Diego, CA (US)

(72) Inventors: Alexander Jason Whitmore, San Diego, CA (US); Ronald Kevin Arp, Ramona, CA (US); Kristen Diane Ceccheti, Poway, CA (US); Michael Vernon Henson, San Diego, CA (US)

(73) Assignee: Daylight Solutions, Inc., San Diego, CA (US)

( * ) Notice: Subject to any disclaimer, the term of this patent is extended or adjusted under 35 U.S.C. 154(b) by 327 days.

(21) Appl. No.: 14/522,290

(22) Filed: Oct. 23, 2014

(65) Prior Publication Data

US 2015/0109768 A1    Apr. 23, 2015

Related U.S. Application Data

(60) Provisional application No. 61/894,812, filed on Oct. 23, 2013.

(51) Int. Cl.
| | |
|---|---|
| *F21L 4/02* | (2006.01) |
| *F21V 23/00* | (2015.01) |
| *H01S 5/40* | (2006.01) |
| *H01S 5/34* | (2006.01) |

(52) U.S. Cl.
CPC ............. *F21L 4/022* (2013.01); *F21V 23/008* (2013.01); *H01S 5/3401* (2013.01); *H01S 5/4087* (2013.01)

(58) Field of Classification Search
CPC ....... F21L 4/022; H01S 5/3401; F21V 23/008
See application file for complete search history.

(56) References Cited

U.S. PATENT DOCUMENTS

| | | | |
|---|---|---|---|
| 6,134,257 A | 10/2000 | Capasso et al. | |
| 6,400,744 B1 | 6/2002 | Capasso et al. | |
| 7,424,042 B2 | 9/2008 | Day et al. | |
| 7,466,734 B1 | 12/2008 | Day et al. | |
| 7,492,806 B2 | 2/2009 | Day et al. | |
| 7,535,656 B2 | 5/2009 | Day et al. | |
| 7,535,936 B2 | 5/2009 | Day et al. | |
| 7,733,925 B2 | 6/2010 | Pushkarsky et al. | |
| 7,796,341 B2 | 9/2010 | Day et al. | |
| 7,826,503 B2 | 11/2010 | Day et al. | |
| 7,848,382 B2 | 12/2010 | Weida et al. | |
| 7,873,094 B2 | 1/2011 | Day et al. | |

(Continued)

*Primary Examiner* — Dung Nguyen
(74) *Attorney, Agent, or Firm* — Roeder & Broder LLP; Steven G. Roeder

(57) ABSTRACT

A light source assembly includes a housing assembly, a plurality of disparate light sources that are coupled to the housing assembly, a power source, a control system and a selector assembly. Each of the light sources generates an output beam that is directed away from the housing assembly, wherein each of the output beams has a center wavelength that is in a different wavelength range than each of the other output beams. The power source provides electrical power to each of the light sources. The control system selectively controls the electrical power that is provided by the power source to the light sources. The selector assembly is electrically connected to the control system, and is selectively controllable to selectively direct current to each of the light sources to generate the desired output beams.

22 Claims, 13 Drawing Sheets

(56) References Cited

U.S. PATENT DOCUMENTS

| | | |
|---|---|---|
| 7,920,608 B2 | 4/2011 | Marsland, Jr. et al. |
| 8,027,094 B2 | 9/2011 | Day et al. |
| 8,050,307 B2 | 11/2011 | Day et al. |
| 8,068,521 B2 | 11/2011 | Weida et al. |
| 8,189,630 B2 | 5/2012 | Marsland, Jr. et al. |
| 8,306,077 B2 | 11/2012 | Pushkarsky et al. |
| 8,335,413 B2 | 12/2012 | Dromaretsky et al. |
| 8,442,081 B2 | 5/2013 | Marsland, Jr. et al. |
| 8,467,430 B2 | 6/2013 | Caffey et al. |
| 8,565,275 B2 | 10/2013 | Pushkarsky et al. |
| 8,718,105 B2 | 5/2014 | Weida et al. |
| 8,774,244 B2 | 7/2014 | Pushkarsky et al. |
| 2010/0283404 A1* | 11/2010 | Thoren, Sr. ............. F41G 1/473 315/294 |
| 2011/0222566 A1* | 9/2011 | Weida .................... B82Y 20/00 372/25 |

\* cited by examiner

LIGHT SOURCE ASSEMBLY WITH MULTIPLE, DISPARATE LIGHT SOURCES

RELATED APPLICATION

This application claims priority on U.S. Provisional Application Ser. No. 61/894,812, filed Oct. 23, 2013 and entitled "LIGHT SOURCE ASSEMBLY WITH MULTIPLE, DISPARATE LIGHT SOURCES". As far as permitted, the contents of U.S. Provisional Application Ser. No. 61/894,812 are incorporated herein by reference.

BACKGROUND

A signal beacon or flashlight can be utilized in conjunction with a detector assembly for various purposes in a military environment and/or in a civilian environment. For example, a signal beacon or flashlight can be utilized in conjunction with a detector assembly for purposes of search and rescue, identification (e.g., of friend or foe), surveillance, targeting, and/or navigation. There is an ongoing desire to improve the capabilities of a signal beacon or flashlight that can be used for such applications.

SUMMARY

The present invention is directed toward a light source assembly for use by a user. In various embodiments, the light source assembly comprises a housing assembly, a first laser source, a second laser source, a power source, a control system and a selector assembly. The first laser source is coupled to the housing assembly. The first laser source generates a coherent, first output beam that is directed away from the housing assembly. In certain embodiments, the first output beam has a first center wavelength that is in a long-wavelength infrared range of between approximately eight and fifteen micrometers. The second laser source is also coupled to the housing assembly. The second laser source generates a coherent, second output beam that is directed away from the housing assembly. In certain embodiments, the second output beam has a second center wavelength that is in a mid-wavelength infrared range of between approximately three and eight micrometers. The power source is coupled to the housing assembly. Additionally, the power source provides electrical power for the first laser source and the second laser source. The control system is also coupled to the housing assembly. The control system selectively controls the electrical power that is provided by the power source to the first laser source and the second laser source. The selector assembly is electrically connected to the control system. In certain embodiments, the selector assembly is selectively controllable by the user to select a first selector setting in which the control system directs pulses of current from the power source to the first laser source in a first duty cycle, and directs pulses of current from the power source to the second laser source in a second duty cycle that is different from the first duty cycle so that the first output beam and the second output beam are pulsed in an alternating manner.

With the design alternatives described in detail herein, in various embodiments, the light source assembly can be used as a beacon or flashlight for various purposes, in conjunction with a detector assembly. For example, in various applications, the light source assembly can be used with the detector assembly for purposes of identification, surveillance, search and rescue, targeting, and/or navigation.

In certain embodiments, at least one of the first laser source and the second laser source includes a quantum cascade gain medium. Additionally and/or alternatively, each of the first laser source and the second laser source can include a quantum cascade gain medium.

Additionally, in some embodiments, the selector assembly is selectively controllable by the user to select a second selector setting in which the control system directs current from the power source to the first laser source so that the first laser source generates the first output beam. In some such embodiments, the selector assembly is further selectively controllable by the user to select a third selector setting in which the control system directs current from the power source to the second laser source so that the second laser source generates the second output beam.

In various embodiments, a first peak power of the first output beam generated by the first laser source is greater than approximately one watt, and a second peak power of the second output beam generated by the second laser source is greater than approximately one watt. In alternative, non-exclusive embodiments, the first laser source and the second laser source each include a quantum cascade gain medium and each is designed and controlled to generate an output beam having a peak power of greater than approximately 0.5, 1, 1.5, 2, 2.5, 3, or 4 watts.

Additionally, in certain embodiments, each of the first output beam and the second output beam is an uncollimated beam. Further, in some embodiments, the first output beam is emitted along a first beam axis and the second output beam is emitted along a second beam axis. In such embodiments, the first beam axis can be spaced apart from and substantially parallel to the second beam axis.

In some embodiments, the housing assembly includes a first housing aperture and a spaced apart second housing aperture. In such embodiments, the first output beam is directed away from the housing assembly through the first housing aperture and the second output beam is directed away from the housing assembly through the second housing aperture.

Additionally, in various embodiments, the light source assembly can further comprise a thermal shield that is coupled to the housing assembly. The thermal shield includes a shield body that is spaced apart from the housing assembly. Moreover, the shield body can include a lattice-type design that inhibits energy external to the housing assembly from contacting the housing assembly, while allowing natural convection cooling of a surface of the housing assembly.

In certain embodiments, the light source assembly further comprises a third light source that is coupled to the housing assembly. In such embodiments, the third light source generates a third output beam that is directed away from the housing assembly. Additionally, the third output beam can have a third center wavelength that is in one of a short-wavelength infrared range of between approximately one point four and three micrometers, a near-infrared wavelength range of between approximately seven hundred fifty nanometers and one point four micrometers, and a visible wavelength range of between approximately three hundred eighty and seven hundred nanometers.

In certain applications, the present invention is further directed toward embodiments of an operational assembly including the light source assembly as described above, and a detector assembly that selectively detects each of the first output beam and the second output beam.

Additionally, in some embodiments, the present invention is also directed toward a light source assembly for use by a user, the light source assembly comprising (A) a housing assembly; (B) a first light source that is coupled to the housing assembly, the first light source generating a first output beam that is directed away from the housing assembly, the first output beam having a first center wavelength that is in a first wavelength range; (C) a second light source that is coupled to the housing assembly, the second light source generating a second output beam that is directed away from the housing assembly, the second output beam having a second center wavelength that is a second wavelength range that is different than the first wavelength range; (D) a third light source that is coupled to the housing assembly, the third light source generating a third output beam that is directed away from the housing assembly, the third output beam having a third center wavelength that is in a third wavelength range that is different than the first wavelength range and the second wavelength range, wherein each of the wavelength ranges is one of (i) a long-wavelength infrared range of between approximately eight and fifteen micrometers, (ii) a mid-wavelength infrared range of between approximately three and eight micrometers, (iii) a short-wavelength infrared range of between approximately one point four and three micrometers, (iv) a near-infrared wavelength range of between approximately seven hundred fifty nanometers and one point four micrometers, and (v) a visible wavelength range of between approximately three hundred eighty and seven hundred nanometers; (E) a power source that is coupled to the housing assembly, the power source providing electrical power for the first light source, the second light source and the third light source; and (F) a control system that is coupled to the housing assembly, the control system selectively controlling the electrical power that is provided by the power source to selectively activate each of the first light source, the second light source and the third light source.

It should be understood that although a number of different embodiments of a light source assembly are illustrated and described herein below, one or more features of any one embodiment can be combined with one or more features of one or more of the other embodiments, provided that such combination satisfies the intent of the present invention.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1A:
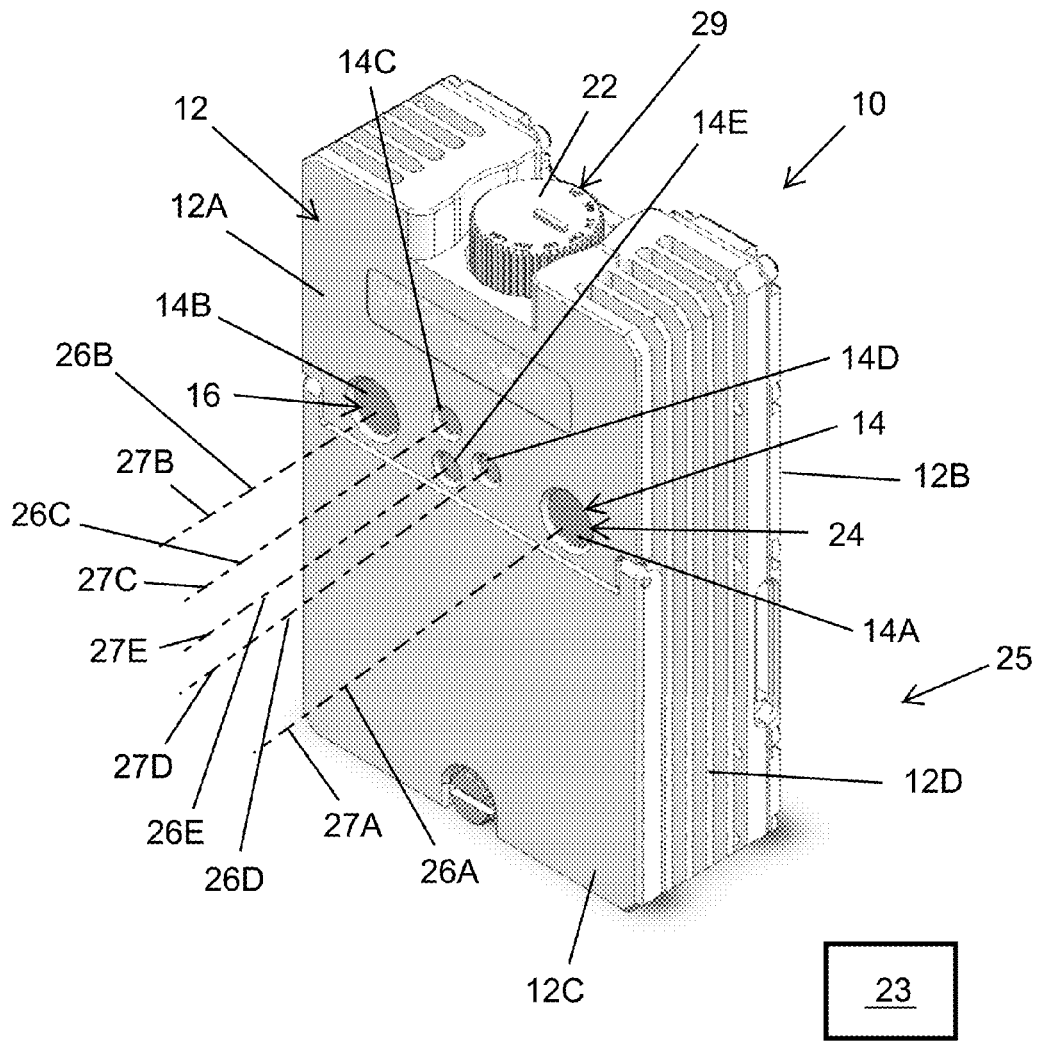
FIG. 1A is a simplified front perspective view of an embodiment of a light source assembly having features of the present invention.

FIG. 1A is a simplified front perspective view of an embodiment of a light source assembly 10 having features of the present invention. The design of the light source assembly 10 can be varied to suit the specific requirements and intended uses of the light source assembly 10. As illustrated, in various embodiments, the light source assembly 10 includes a housing assembly 12, a plurality of disparate light sources 14, an optical assembly 16, a control system 18 or circuit board (illustrated in FIG. 1D), a power source 20 (illustrated in FIG. 1E), and a selector assembly 22, e.g., a switch. Alternatively, the light source assembly 10 can be designed with more or fewer components than those specifically illustrated and described in this embodiment. For example, in one such alternative embodiment, the light source assembly 10 can be designed without the optical assembly 16.

As an overview, the present invention is directed to a light source assembly 10 that can be used as a beacon or flashlight for various purposes, in conjunction with a detector assembly 23 (illustrated as a box). For example, in various applications, the light source assembly 10 can be used with the detector assembly 23 for purposes of identification, surveillance, search and rescue, targeting, and/or navigation. In certain embodiments, the detector assembly 23 can be a camera that is adapted to selectively detect one or more of the plurality of disparate light sources 14. Moreover, in some embodiments, as discussed herein below, the selector assembly 22 can be manually operated by a user so as to allow the user to select from various possible selector settings, and thus various possible modes of operation, based on the needs of the user at any given time.

As utilized herein, it should be appreciated that the combination of the light source assembly 10 and the detector assembly 23 can be referred to generally as an "operational assembly". During use of the operational assembly 25, the light source assembly 10 is utilized such that any and all of the plurality of disparate light sources 14 can be selectively activated, and the detector assembly 23 is utilized to selectively detect output beams from each of the plurality of disparate light sources 14.

In one application, for identification, e.g., in military operations, it is important to be able to quickly and accurately identify any individual, group, vehicle or device as friend or foe. In this application, the individuals or groups (e.g., soldiers), vehicles and/or devices could have light source assemblies 10 that can utilize the disparate light sources 14 alternatively and/or at specifically designated pulse rates (i.e. the light source assembly 10 is fully programmable such that the disparate light sources 14 can be coded in any suitable or desired manner) to identify the owner as friendly. Conversely, absence of and/or non-properly coded usage of such light source assemblies 10 can be interpreted as the owner being a foe. Additionally, in such applications, the light source assembly 10 can be handheld, uniform-mounted, helmet-mounted, and/or mounted on a portion of the vehicle or device. Moreover, the light source assembly 10 can be pointed (similar to a flashlight) to identify something.

In another application, the command and control of a battlefield will want to keep track of the relative positions of people and military equipment. As provided herein, each person or each piece of military equipment can include a light source assembly 10 that is controlled to selectively activate disparate light sources 14 and/or pulse the light sources 14 at a different rate (coded in any suitable or desired manner). With this design, the different light sources 14 and/or different pulse rates can be recognized to locate and individually identify the location of multiple assets based on the sequence of the pulsing of the beams of the light sources using a detector assembly 23 that captures images of the battlefield.

In still another application, i.e. for surveillance, one or more light source assemblies 10 could be used to define a search area for the detector assembly 23. With this design, something moving in front of the light source assembly 10 would result in a disappearance of signal that could be used to trigger an event, much like near-infrared diodes are used in applications such as making sure that the path is clear before closing a garage door.

In yet another application, i.e. for use in search and rescue operations, life rafts, life vests, or soldiers' kits could all include one or more light source assemblies 10 that could be activated in an emergency. With this design, the emitted signal from the light source assembly 10 would allow easier, faster and more accurate spotting with the detector assembly 23, and could also be invisible to hostile forces if the emitted and detected light sources 14 are not widely used. Additionally, in this design, the light sources 14 can be viewed day and night, and in inclement conditions for search and rescue operations.

In another alternative application, i.e. for targeting, a light source assembly 10 could be placed on a target of interest surreptitiously, and left operating for later targeting with a detector assembly 23.

In still yet another alternative application, i.e. for navigation, one or more light source assemblies 10 can be used to help navigate in conditions such as dust and fog, and/or when normal visibility may be otherwise impaired. In this design, multiple light source assemblies 10 could be used to define roads or runways.

As provided herein, in various applications, any information can be coded in the beacon signal emitted by the light source assembly 10 by adjusting the specific light sources 14 that are activated and/or the pulse rate of the light sources 14 of the light source assembly 10. Stated in another manner, the light source assembly 10 can be fully programmable to selectively activate any and all of the light sources 14 in any desired manner. For example, in one non-exclusive application, the pulse rate of the light sources 14 can be adjusted to provide a message in Morse code. Additionally, in certain embodiments, the length and timing of each pulse can be long enough to be effectively captured by the detector assembly 23. For example, each pulse can be longer than the exposure time of the detector assembly 23 to make sure the pulse is captured by the detector assembly 23. Further, in one embodiment, the pulse rate of the light source assembly 10 can be synchronized with the capture rate of the detector assembly 23. With this design, the light source assembly 10 can be controlled to generate the desired light beam(s) while the detector assembly 23 is capturing such light. As one example, the detector assembly 23 can emit a signal (e.g., a RF signal) that is received by the laser source assembly 10 to synchronize them. Alternatively, the detector assembly 23 and one or more of the light source assemblies 10 can be synchronized prior to the beginning of the operation. Still alternatively, the detector assembly 23 and the laser source assemblies 10 can receive a signal from a GPS that can be used to synchronize the devices.

It should be noted that either physical, inductive, or radio frequency signals can be used to program the coding of pulses (pulse width, pulse rate, pulse repetition, Morse, etc.) of any of the light sources 14.

Additionally, in certain embodiments, the light source assembly 10 is designed to be small, portable, lightweight, stable, rugged, easy to manufacture, reliable, efficient for longer use of the power source 20, and relatively inexpensive to manufacture. Further, the light source assembly 10 is further designed to be usable at sufficient distances that the signals can be detected from outside a danger zone, e.g., in certain applications, the light source assembly 10 can have a range of greater than three kilometers. As a result thereof, the light source assembly 10 can be used in many applications, such as those specifically noted above, as a signal beacon or flashlight.

The housing assembly 12 retains various components of the light source assembly 10. For example, in certain embodiments, the plurality of disparate light sources 14, the optical assembly 16, the control system 18 and the power source 20 can all be coupled to, secured to, and/or retained substantially within the housing assembly 12.

The design of the housing assembly 12 can be varied. In the embodiment illustrated in FIG. 1A, the housing assembly 12 includes a housing front 12A, a housing rear 12B, a power compartment cover 12C, and a plurality of heat spreaders 12D, e.g., fins. Alternatively, the housing assembly 12 can include more or fewer components than specifically illustrated in this embodiment.

As shown, the housing front 12A can include a plurality of housing apertures 24, with each housing aperture 24 being aligned to allow for the emitting and directing of the plurality of disparate light sources 14 out of and/or away from the housing assembly 12 and away from the light source assembly 10, such that the light sources 14 can be quickly, easily and accurately detected by the detector assembly 23. In particular, in this embodiment, the housing front 12A includes five housing apertures 24 to allow for the selective and/or alternative emitting and directing of five disparate light sources 14 from the light source assembly 10. Alternatively, the housing front 12A can include greater than five or fewer than five housing apertures 24. For example, in some embodiments, more than one light source 14 can be directed away from the housing assembly 12 through a common housing aperture 24, thus requiring fewer housing apertures 24 than light sources 14 in such embodiments. Still alternatively, the housing apertures 24 can be located in a different portion of the housing assembly 12.

Figure 1B:
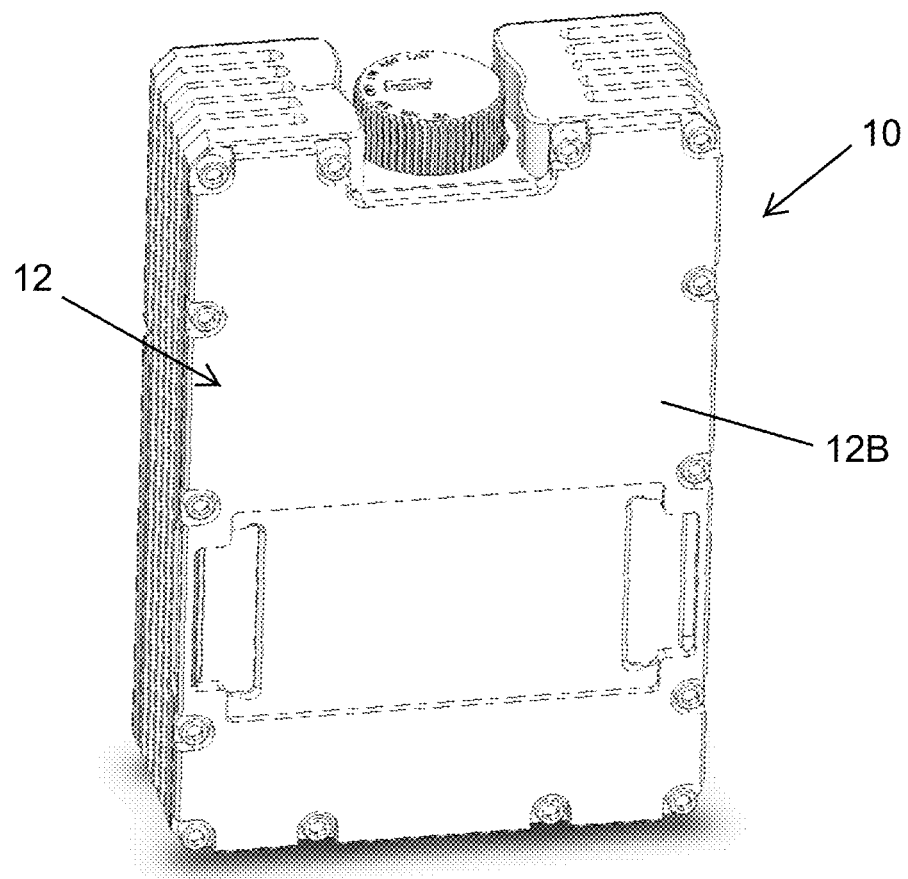
FIG. 1B is a simplified rear perspective view of the light source assembly of FIG. 1A.

In certain embodiments, the housing rear 12B provides the necessary housing for the various components of the housing assembly 10 that are positioned at or near the rear of the light source assembly 10. FIG. 1B is a simplified rear perspective view of the light source assembly 10 of FIG. 1A. More particularly, FIG. 1B more clearly illustrates one non-exclusive alternative design for the housing rear 12B of the housing assembly 12.

Returning to FIG. 1A, the power compartment cover 12C protects and/or covers the power source 20 as the power source 20 is coupled to, secured to, and/or positioned within the housing assembly 12. In one embodiment, the power compartment cover 12C can be selectively and independently removed and/or opened to allow for any changes or modifications to the power source 20.

The heat spreaders 12D help to spread and/or transfer heat from the light source assembly 10, i.e. to effectively move heat away from the light sources 14. More particularly, in one non-exclusive alternative embodiment, the heat spreaders 12D can comprise a plurality of fins that provide greater surface area for the housing assembly 12 as a means to more effectively transfer heat away from the light sources 14 and/or other components of the light source assembly 10 and into the surrounding environment. Alternatively, the heat spreaders 12D can have a different design than that shown in the Figures. Still alternatively, the housing assembly 12 can be designed without the heat spreaders 12D.

It should be appreciated that the light source assembly 10 is designed to provide natural convection cooling for the light sources 14 and the other components of the light source assembly 10. With such design, the housing assembly 12 can be designed without the heat spreaders 12D; although the heat spreaders 12D, as described, can further enhance the ability of the light source assembly 10 to effectively move heat away from the light sources 14 and the other components of the light source assembly 10.

Additionally, the overall shape and size of the housing assembly 12 can be varied to suit the specific requirements of the light source assembly 10. For example, in certain embodiments, the housing assembly 12 can be substantially rectangular box shaped and can have a length of between approximately 2-4 inches, a width of between approximately 2-3 inches, and a thickness of between approximately 0.5-1.25 inches. In one non-exclusive embodiment, the housing assembly 12 is substantially rectangular box shaped, and has a length of 3.75 inches, a width of 2.5 inches, and a thickness of 1 inch. Alternatively, in other suitable embodiments, the housing assembly 12 can be other that substantially rectangular box shaped, and/or the housing assembly 12 can have a length, width and thickness that are greater than or less than the specific dimensions discussed herein above.

In yet another non-exclusive example, the housing assembly 12 has a cylindrical shape with a diameter of between approximately 1-4 inches and a thickness of between approximately 0.5-3 inches.

The number, type, design, positioning and orientation of the disparate light sources 14 can be varied depending on the specific requirements of the light source assembly 10. In the embodiment illustrated in FIG. 1A, the light source assembly 10 includes five disparate light sources 14, i.e. a first light source 14A, a second light source 14B, a third light source 14C, a fourth light source 14D and a fifth light source 14E that are each coupled to, secured to, and/or positioned substantially within the housing assembly 12.

Additionally, each of the light sources 14 can be designed and/or individually tuned to provide an output beam having a specific wavelength. For example, in one non-exclusive alternative embodiment, (i) the first light source 14A can be a long-wavelength infrared light source that generates and/or emits a first output beam 26A having a center wavelength that is in a long-wavelength infrared range of between approximately eight micrometers and fifteen micrometers; (ii) the second light source 14B can be a mid-wavelength infrared light source that generates and/or emits a second output beam 26B having a center wavelength that is in a mid-wavelength infrared range of between approximately three micrometers and eight micrometers; (iii) the third light source 14C can be a short-wavelength infrared light source that generates and/or emits a third output beam 26C having a center wavelength that is in a short-wavelength infrared range of between approximately one point four (1.4) micrometers and three micrometers; (iv) the fourth light source 14D can be a near-infrared light source that generates and/or emits a fourth output beam 26D having a center wavelength that is in a near-infrared wavelength range of between approximately seven hundred fifty nanometers (i.e. 0.75 micrometers) and one point four (1.4) micrometers; and (v) the fifth light source 14E can be a visible light source that generates and/or emits a fifth output beam 26E having a center wavelength that is in a visible wavelength range of between approximately three hundred eighty and seven hundred nanometers. Alternatively, one or more of the light sources 14A-14E can be different than those specifically identified herein above (e.g., the light sources 14A-14E can have different wavelengths such as those for a far-infrared light source, an ultraviolet light source, an X-ray light source, or another appropriate light source), and/or the light sources 14A-14E can be positioned and/or oriented relative to one another in a different manner than is shown in FIG. 1A. Still alternatively, the light source assembly 10 can include greater than five or fewer than five disparate light sources 14.

Further, as shown in FIG. 1A, each of the light sources 14A-14E generates and/or emits an independent output beam. In particular, (i) the first light source 14A generates and/or emits the first output beam 26A (illustrated with a dashed line), e.g., a long-wavelength infrared output beam, along a first beam axis 27A; (ii) the second light source 14B generates and/or emits the second output beam 26B (illustrated with a dashed line), e.g., a mid-wavelength infrared output beam, along a second beam axis 27B; (iii) the third light source 14C generates and/or emits the third output beam 26C (illustrated with a dashed line), e.g., a short-wavelength infrared output beam, along a third beam axis 27C; (iv) the fourth light source 14D generates and/or emits the fourth output beam 26D (illustrated with a dashed line), e.g., a near-wavelength infrared output beam, along a fourth beam axis 27D; and (v) the fifth light source 14E generates and/or emits the fifth output beam 26E (illustrated with a dashed line), e.g., a visible light output beam, along a fifth beam axis 27E. In some embodiments, such as the embodiment illustrated in FIG. 1A, each of the output beams 26A-26E can be spaced apart from and substantially parallel to each of the other output beams 26A-26E. Thus, in such embodiments, each of the beam axes 27A-27E can be spaced apart from and substantially parallel to each of the other beam axes 27A-27E.

Alternatively, in other embodiments, one or more of the output beams 26A-26E can be directed away from the housing assembly 12 at an angle relative to any of the other output beams 26A-26E, such that the output beams 26A-26E, and thus the beam axes 27A-27E, are not parallel to one another. For example, in some such alternative embodiments, one or more of the output beams 26A-26E can be directed away from the housing assembly 12 through a different face of the housing assembly 12, e.g., the first output beam 26A and the second output beam 26B can be directed away from a front surface 344A (illustrated in FIG. 3) of the housing assembly 12, the third output beam 26C can be directed away from a first side surface 344B (illustrated in FIG. 3) of the housing assembly 12, the fourth output beam 26D can be directed away from a rear surface 344C (illustrated in FIG. 3) of the housing assembly 12, and the fifth output beam 26E can be directed away from a second side surface 344D (illustrated in FIG. 3) of the housing assembly 12. It should be appreciated that in various alternative embodiments, each of the output beams 26A-26E can be directed away from the housing assembly 12 in any desired direction(s), away from any surface(s) of the housing assembly 12, and/or through any housing aperture(s) 24.

In various embodiments, each of the output beams 26A-26E can be viewable with the detector assembly 23. Stated in another manner, during use, the detector assembly 23 can selectively detect each of the output beams 26A-26E that are generated and/or emitted by the light sources 14A-14E. Additionally, in some embodiments, the output beams 26A-26E can have high peak (maximum) pulsed (or continuous wave) intensities, e.g., greater than one watt, greater than two watts, etc., that enable viewing of the output beams 26A-26E over large distances. Moreover, one or more of the output beams 26A-26E can be viewable day and night, and through inclement weather conditions (e.g., fog, rain, snow, smoke, clouds, or dust in the atmosphere).

It should be appreciated that the use of the terms "first light source", "second light source", "third light source", "fourth light source", and "fifth light source" is merely for purposes of convenience and ease of illustration, and any of the light sources 14A-14E can be equally referred to as the "first light source", the "second light source", the "third light source", the "fourth light source", and/or the "fifth light source". Similarly, it should also be appreciated that the use of the terms "first output beam", "second output beam", "third output beam", "fourth output beam", and "fifth output beam" is merely for purposes of convenience and ease of illustration, and any of the output beams 26A-26E can be equally referred to as the "first output beam", the "second output beam", the "third output beam", the "fourth output beam", and/or the "fifth output beam". Still similarly, it should further be appreciated that the use of the terms "first beam axis", "second beam axis", "third beam axis", "fourth beam axis", and "fifth beam axis" is merely for purposes of convenience and ease of illustration, and any of the beam axes 27A-27E can be equally referred to as the "first beam axis", the "second beam axis", the "third beam axis", the "fourth beam axis", and/or the "fifth beam axis".

In certain embodiments, the optical assembly 16 can be provided to enable any desired focusing, shaping and directing of the output beams 26A-26E from each of the plurality of disparate light sources 14A-14E. For example, in certain embodiments, the optical assembly 16 can include one or more lenses, and/or other optical elements to enable any desired focusing, shaping and directing of the output beams 26A-26E from each of the plurality of disparate light sources 14A-14E. Additionally and/or alternatively, the optical assembly 16 can include a window designed such that the output beams 26A-26E are not collimated, i.e. are uncollimated. Still alternatively, one or more of the output beams 26A-26E can be directed away from the housing assembly 12 of the light source assembly 10 without the need for any optical elements. In such embodiments, each of the output beams 26A-26E will again be uncollimated.

The control system 18 (illustrated in FIG. 1D) is coupled to, secured to, and/or positioned substantially within the housing assembly 12. During use, the control system 18 enables the necessary and desired control of the operation of the light source assembly 10, i.e. the selective operation of one or more of the plurality of disparate light sources 14, by selectively controlling the electrical power that is provided by the power source 20 to the light sources 14A-14E. In certain applications, the control assembly 18 selectively directs current from the power source 20 to one of the light sources 14 such that only one light source 14 is activated at a time. Alternatively, in other applications, the control system 18 can selectively direct current from the power source 20 to one of the light sources 14, e.g., the first light source 14A, in a first duty cycle, and direct current from the power source 20 to another of the light sources 14, e.g., the second light source 14B, in a second duty cycle that is different from the first duty cycle. In such embodiments, the control system 18 can selectively activate multiple light sources 14 such that any two of the output beams 26A-26E can be generated in an alternating (or random) pattern. Still alternatively, in still other embodiments, the control system 18 can selectively direct current from the power source 20 to multiple light sources 14 so as to enable multiple light sources 14 to be activated at any given time. One non-exclusive embodiment of an exemplary control system 18 that can be used with the present invention is illustrated in and will be described in greater detail in relation to FIG. 1D.

The power source 20 is coupled to, secured to, and/or positioned substantially within the housing assembly 12. In various embodiments, the power source 20 provides the necessary and desired electrical power to effectively and efficiently operate the light source assembly 10, i.e. to selectively activate and control one or more of the plurality of disparate light sources 14.

Figure 1C:
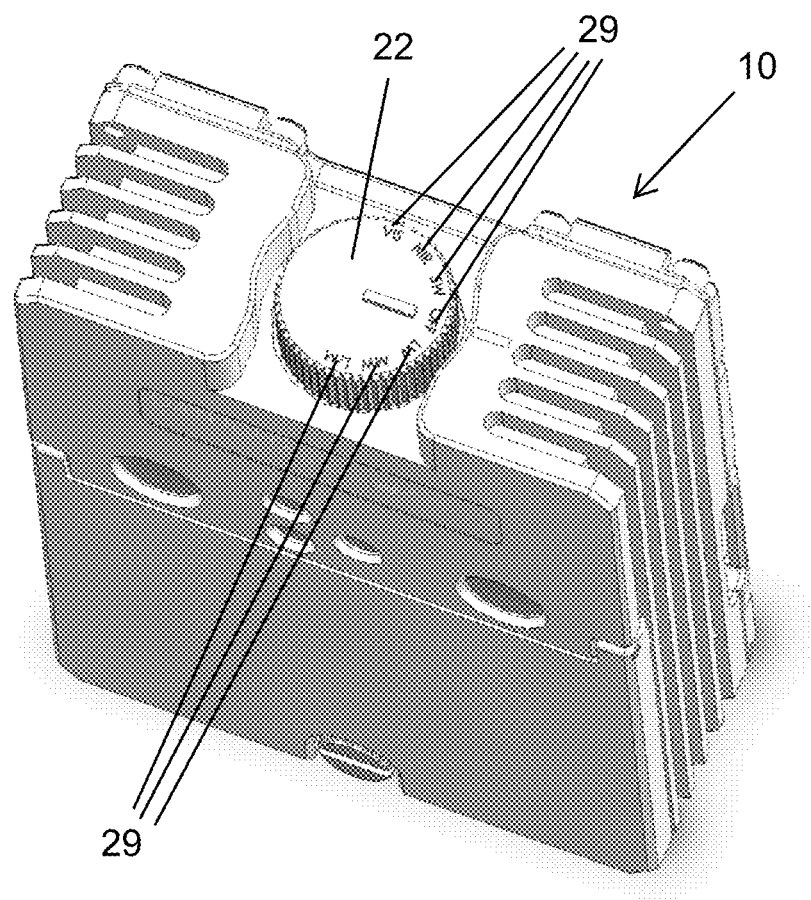
FIG. 1C is a simplified top perspective view of the light source assembly of FIG. 1A.

The selector assembly 22 is electrically connected to the control system 18. In certain embodiments, the selector assembly 22 enables the user to selectively choose between a variety of potential modes of operation via a plurality of selector settings 29. The potential modes of operation and/or the specific selector settings 29 can be varied to suit the specific design requirements of the light source assembly 10. FIG. 1C is a simplified top perspective view of the light source assembly 10 of FIG. 1A, which provides a clear illustration of some of the selector settings 29 available in this embodiment via the selector assembly 22. For example, the selector assembly 22 shows that the user can select between the following modes of operation and/or selector settings 29: (i) on, with the long-wavelength infrared light source 14A (illustrated in FIG. 1A) and the mid-wavelength infrared light source 14B (illustrated in FIG. 1A) operating in an alternating manner; (ii) on, using the mid-wavelength infrared light source 14B; (iii) on, using the long-wavelength infrared light source 14A; (iv) on, using the short-wavelength infrared light source 14C (illustrated in FIG. 1A); (v) on, using the near-infrared light source 14D (illustrated in FIG. 1A); (vi) on, using the visible light source 14E (illustrated in FIG. 1A); and (vii) off. It should be appreciated that the potential modes of operation and/or selector settings 29 can be expanded to include a combined and/or alternating use of any combination of the plurality of light sources 14A-14E illustrated specifically herein. Additionally, it should further be appreciated that the potential modes of operation and/or selector settings 29 can be expanded to include individual and/or combined (e.g., alternating) use of any other light sources that may potentially be included within the light source assembly 10.

Additionally, in certain embodiments, the selector assembly 22 can further be adjusted by the user to enable the selective adjustment of a pulse rate and/or duty cycle of the emission of the output beams 26A-26E (illustrated in FIG. 1A) when the output beams 26A-26E are generated and/or emitted in a pulsed mode of operation, and/or to enable one or more of the output beams 26A-26E to be generated and/or emitted in a continuous wave mode of operation. For example, when it is desired by the user to generate and/or emit the output beams 26A-26E is a pulsed mode of operation, the user can make a selection via the selector assembly 22 such that the control system 18 (illustrated in FIG. 1D) pulses the power, i.e. the current, that is directed from the power source 20 to the light source 14 over time. In one non-exclusive setting, the duty cycle can be approximately fifty percent, e.g. the power can be directed to the light source 14 for a predetermined period of time and alternately the power is not directed to the light source 14 for the same predetermined period. Alternatively, the duty cycle can be greater than or less than fifty percent, i.e. the power can be directed to the light source for a longer or shorter period of time than the power not being directed to the light source 14. Further, when it is desired by the user to generate and/or emits the output beams 26A-26E in a continuous wave mode of operation, the user can make a selection via the selector assembly 22 such that the control system 18 continuously directs power, i.e. current, from the power source 20 to the light source 14.

It should be appreciated that utilizing a pulsed mode of operation can assist the light source assembly 10 in achieving more efficient and/or lower overall power usage by the power source 20, and can further inhibit the undesired generation of heat within the light source assembly 10. Moreover, it should be realized that such benefits can be achieved by utilizing a pulsed mode of operation regardless of whether the light source assembly 10 is utilizing multiple light sources 14A-14E in an alternating manner, or whether the light source assembly 10 is utilizing only a single given light source 14A-14E at any given time.

Simplified graphical illustrations of possible current inputs and beam outputs for each of the settings discussed specifically herein are illustrated and described herein below in relation to FIGS. 4A-4F, with the exception of the "off" setting where no current is provided to any of the light sources 14A-14E and no output beams 26A-26E are generated and emitted by the light source assembly 10.

Figure 1D:
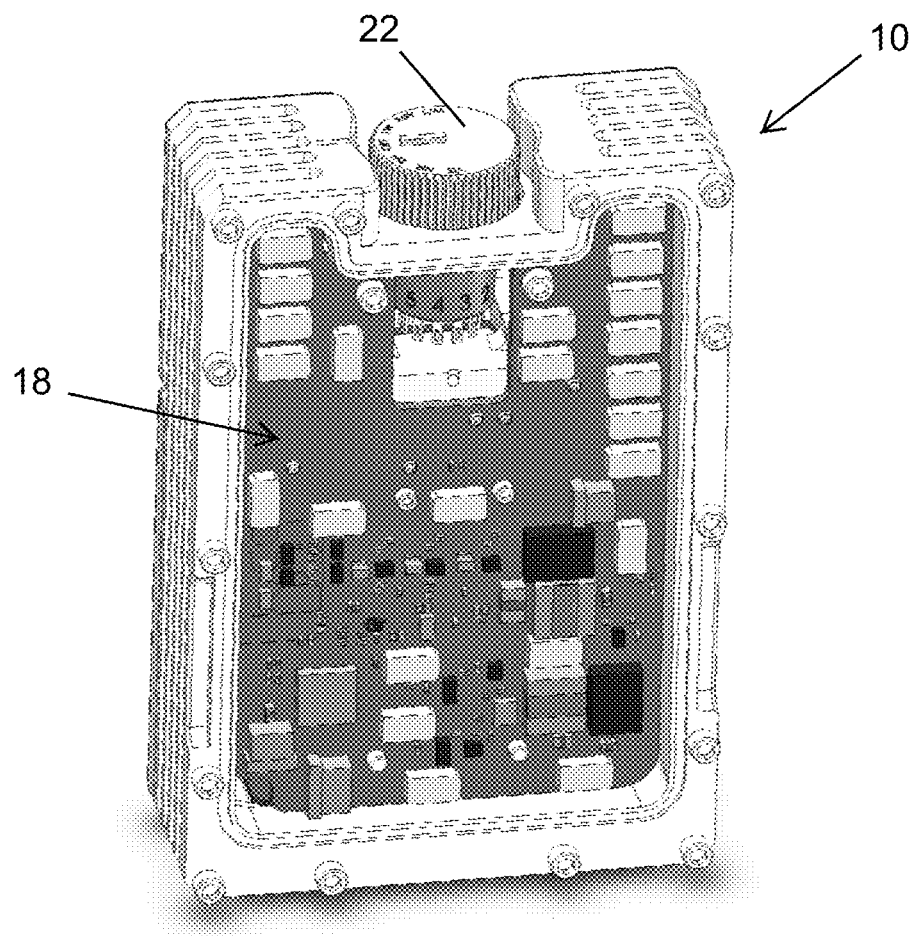
FIG. 1D is a simplified rear perspective view of a portion of the light source assembly of FIG. 1A.

FIG. 1D is a simplified rear perspective view of a portion of the light source assembly 10 of FIG. 1A. In particular, FIG. 1D is a simplified rear perspective view of the light source assembly 10 with the housing rear 12B having been removed so that certain elements, e.g., the control system 18, can be more clearly illustrated.

The control system 18 controls the operation of the light source assembly 10 including the electrical power that is directed from the power source 20 (illustrated in FIG. 1E) to each of the plurality of disparate light sources 14 (illustrated in FIG. 1A) that are included as part of the light source assembly 10. The design of the control system 18 can be varied. For example, the control system 18 can include one or more processors and circuits that are electrically connected to the selector assembly 22. With this design, the processors control the selective operation of each of the plurality of disparate light sources 14.

Additionally, as noted above, in certain embodiments, the control system 18 can direct power to one or more of the light sources 14 in a pulsed fashion to minimize heat generation in, and power consumption by the light sources 14, while still achieving the desired average optical power of the output beams 26A-26E (illustrated in FIG. 1A). This enables more efficient use of the power source 20 such that the power source 20, e.g., one or more batteries, can be used for a longer period of time as compared to when used in a continuous wave mode of operation. Such low battery drain can be crucial for long life of the light source assembly 10 when being used in the field. Additionally, this helps to minimize the heat generated. As a result thereof, this increases the number of operational environments in which the assembly can be used. For example, this allows the assembly to be used in a high temperature desert.

It should be noted that in certain embodiments, active cooling (e.g. with a fan or TEC) of the assembly is not required because of the unique design provided herein. Alternatively, in certain embodiments, the assembly can be actively cooled.

Further, in certain embodiments, the control system 18 can include a boost converter (e.g., a DC-to-DC power converter), a capacitor assembly, a reduction DC-to-DC power converter, a switch assembly, and a processor that can be utilized in conjunction with one another to enable the control system 18 to effectively and efficiently utilize power from the power source 20 to selectively operate each of the plurality of disparate light sources 14.

Figure 1E:
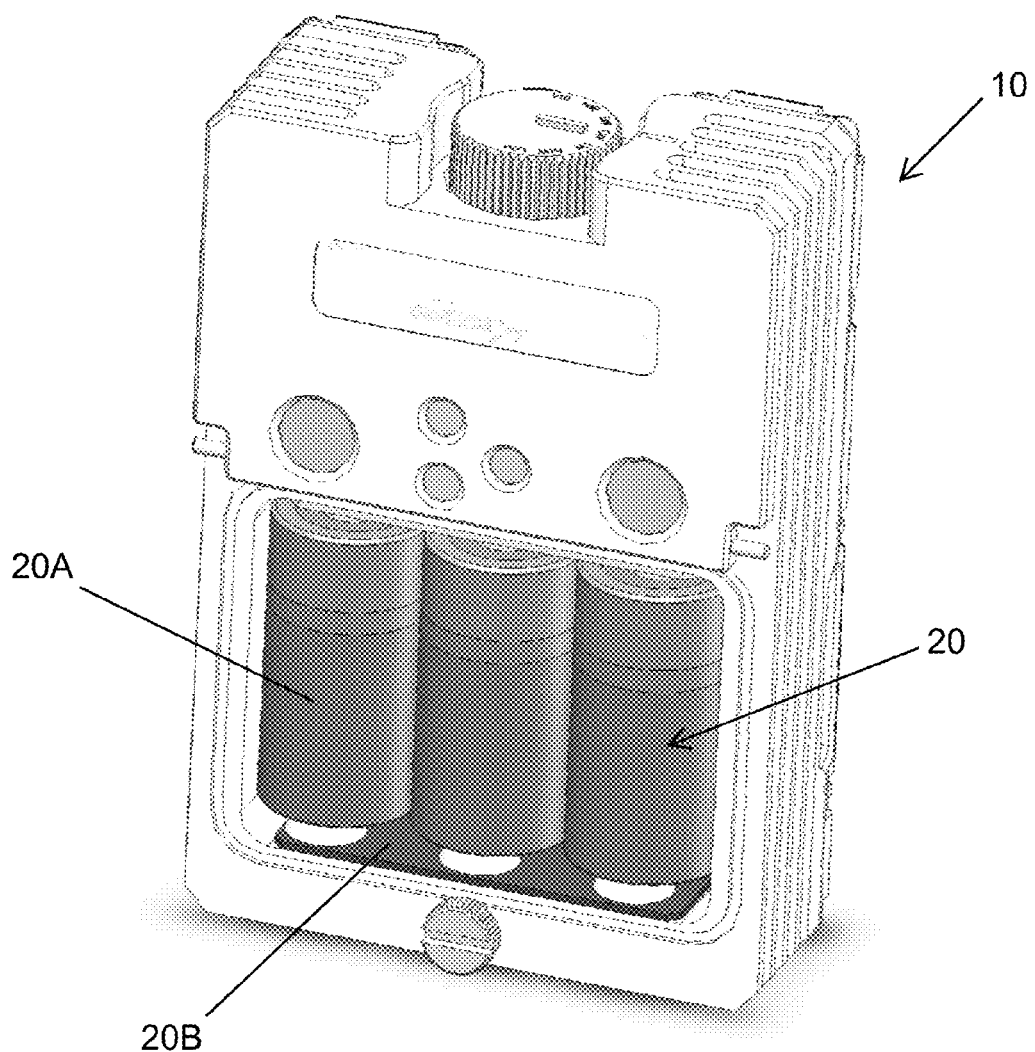
FIG. 1E is a simplified front perspective view of a portion of the light source assembly of FIG. 1A.

FIG. 1E is a simplified front perspective view of a portion of the light source assembly 10 of FIG. 1A. In particular, FIG. 1E is a simplified front perspective view of the light source assembly 10 with the power compartment cover 12C having been removed so that certain elements, e.g., the power source 20, can be more clearly illustrated.

The power source 20 provides electrical power for the light sources 14 (illustrated in FIG. 1A) and the control system 18 (illustrated in FIG. 1D). As shown in FIG. 1E, the power source 20 can include a plurality of batteries 20A that are positioned within a battery compartment 20B. The batteries 20A provide the necessary power for full operation of the light source assembly 10. In one embodiment, as illustrated, the power source 20 can include three batteries 20A. Alternatively, the power source 20 can be designed to include greater than three or fewer than three batteries 20A. Still alternatively, the power source 20 can be designed in another manner, i.e. without the use of batteries 20A.

Figure 1F:
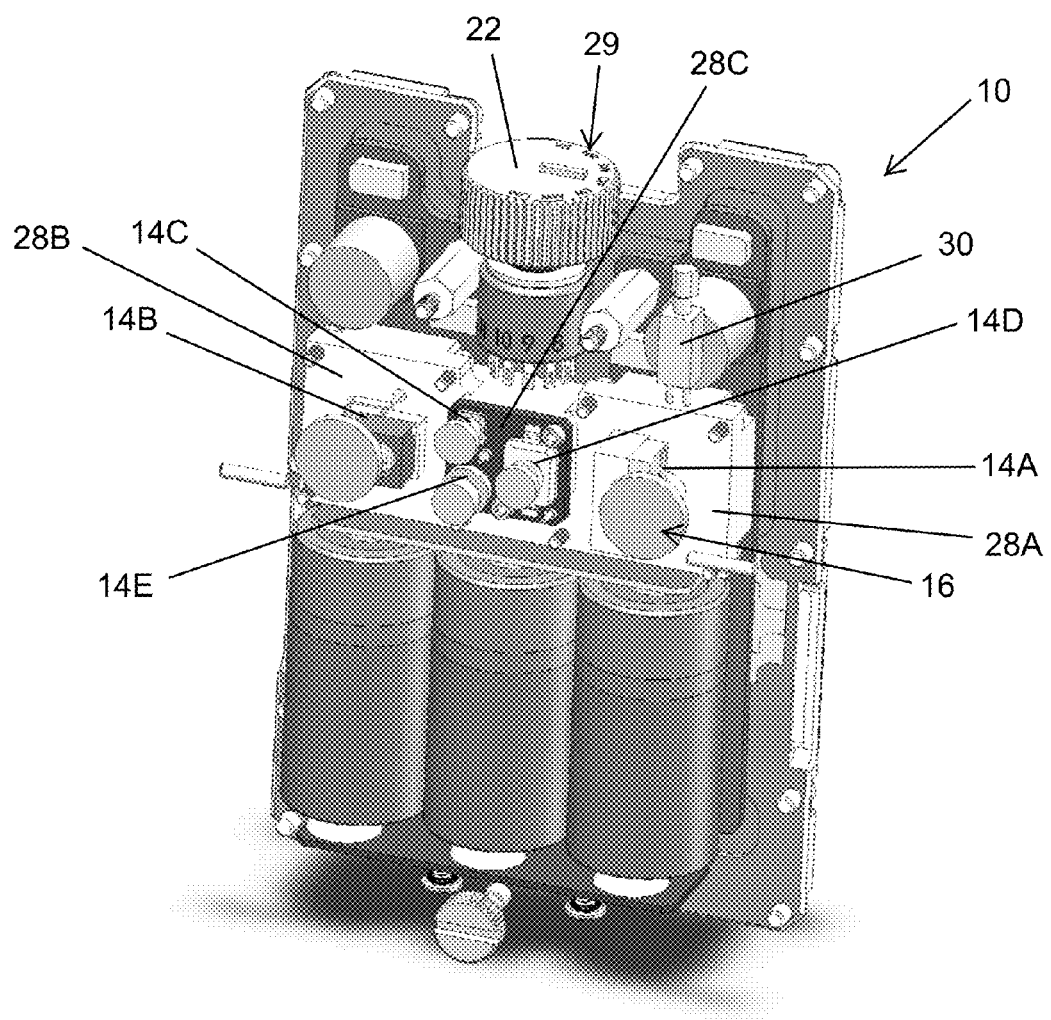
FIG. 1F is a simplified front perspective view of a portion of the light source assembly of FIG. 1A.

FIG. 1F is a simplified front perspective view of a portion of the light source assembly 10 of FIG. 1A. In particular, FIG. 1F is a simplified front perspective view of the light source assembly 10 with the housing assembly 12 having been removed for purposes of more clearly illustrating certain features and aspects of the present invention. For example, FIG. 1F illustrates certain features and aspects of the light sources 14A-14E, and the optical assembly 16 that can be provided to enable any desired focusing, shaping and directing of the output beams 26A-26E (illustrated in FIG. 1A) from each of the plurality of disparate light sources 14A-14E.

The design, positioning and mounting of each of the light sources 14A-14E can be varied to suit the specific design requirements of the light source assembly 10. In some embodiments, the first light source 14A can comprise a quantum cascade laser source (as shown in greater detail in FIG. 1G), the second light source 14B can also comprise a quantum cascade laser source (as shown in greater detail in FIG. 1H), and each of the third light source 14C, the fourth light source 14D and the fifth light source 14E can comprise LED light sources, laser diode and/or photonic crystal light sources. Alternatively, one or more of the light sources 14A-14E can have a different design.

Additionally, in certain embodiments, as shown in FIG. 1F, the first light source 14A can be mounted on a first mounting board 28A, the second light source 14B can be mounted on a second mounting board 28B, and the third light source 14C, the fourth light source 14D and the fifth light source 14E can be mounted together on a common third mounting board 28C. Additionally, in this embodiment, each of the mounting boards 28A-28C are independent of the other mounting boards 28A-28C. Alternatively, the light sources 14A-14E can be mounted in a different manner than specifically shown in FIG. 1F. For example, each of the light sources 14A-14E can be mounted on a single, common mounting board, and/or each of the light sources 14A-14E can be mounted on a separate, independent mounting board.

Further, FIG. 1F further illustrates certain variable aspects for the selector settings 29 that can be chosen by the user via the selector assembly 22.

Still further, FIG. 1F also illustrates that the light source assembly 10 can include an alert system 30. The alert system 30 can be programmable so as to alert the user when and if one or more features of the light source assembly 10 have been activated. The alert system 30 can have any suitable design. For example, in one non-exclusive embodiment, the alert system 30 can include a vibrator that vibrates when and if one or more features of the light source assembly 10 have been activated. More specifically, the alert system 30 can be used to alert the user that one or more of the output beams are being generated. The alert system 30 can also be coded such that a different alert signal is provided depending on the specific settings (e.g. specific output beams) that have been activated within the light source assembly 10.

Figure 1G:
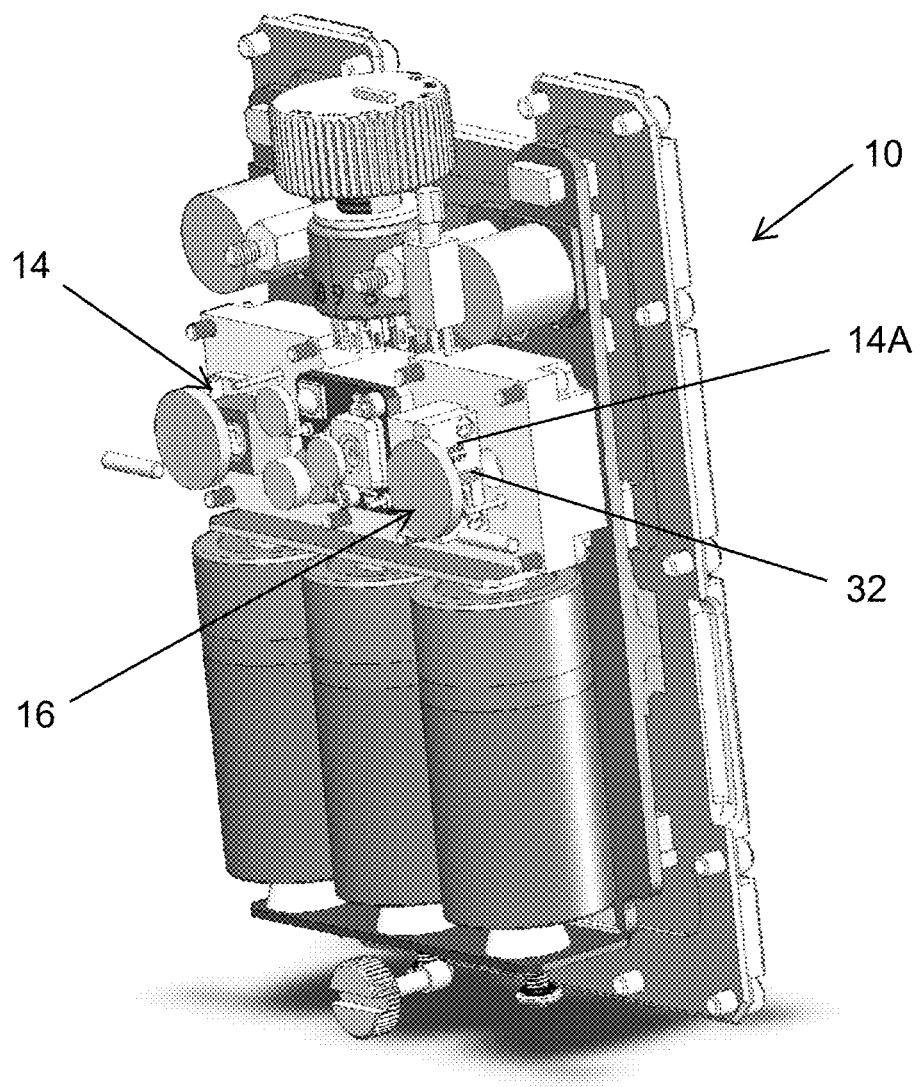
FIG. 1G is a simplified side perspective view of a portion of the light source assembly of FIG. 1A.

FIG. 1G is a simplified side perspective view of a portion of the light source assembly 10 of FIG. 1A. In particular, FIG. 1G illustrates additional features of one or more of the plurality of disparate light sources 14. For example, FIG. 1G illustrates certain features that can be included as part of the first light source 14A.

As illustrated in FIG. 1G, the first light source 14A can be a quantum cascade laser (QCL) that generates and/or emits a coherent, first output beam 26A (illustrated in FIG. 1A). More particularly, in one embodiment, the first light source 14A can include a Quantum Cascade (QC) gain medium 32 that directly emits a light beam, i.e. the first output beam 26A, that is in the long-wavelength infrared range. With this design, electrons transmitted through the QC gain medium 32 emit one photon at each of the energy steps. For example, the QC gain medium 32 can use two different semiconductor materials such as InGaAs and AlInAs (grown on an InP or GaSb substrate, for example) to form a series of potential wells and barriers for electron transitions. The thickness of these wells/barriers determines the wavelength characteristic of the QC gain medium 32. Additionally, in one, non-exclusive such embodiment, the semiconductor QCL laser chip is mounted epitaxial growth side down. Alternatively, the first light source 14A can include an interband-cascade (IC) laser, a diode laser, and/or any other laser capable of generating radiation in the appropriate long-wavelength infrared spectral region.

FIG. 1G further illustrates certain aspects of one non-exclusive embodiment of the optical assembly 16. For example, as related to the first light source 14A, the optical assembly 16 can be positioned substantially adjacent to the QC gain medium 32 in line with the lasing axis. In certain embodiments, the optical assembly 16 can include one lens or more than one lens that collimate and focus the light or can spread the light to provide other beam shapes such as top hat, doughnut, spherical configurations after the beam exits the facet of the QC gain medium 32. In one such embodiment, the optical assembly 16 can include an aspherical lens having an optical axis that is aligned with the lasing axis. Alternatively, the optical assembly 16 can have a different design relative to the first light source 14A. Still alternatively, as noted above, the first light source 14A can be provided without the optical assembly 16, and/or with the optical assembly 16 simply including a window, such that the first output beam 26A is uncollimated.

Figure 1H:
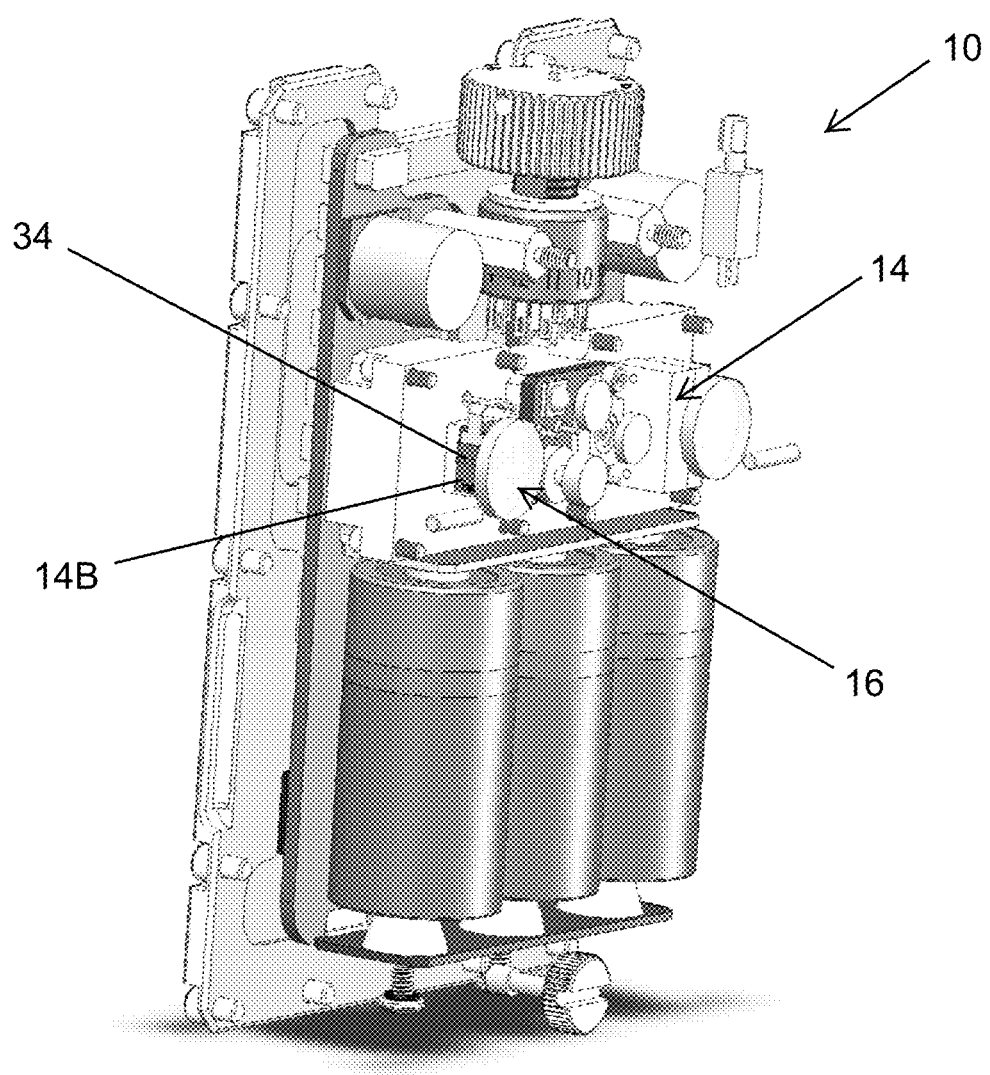
FIG. 1H is a simplified side perspective view of a portion of the light source assembly of FIG. 1A.

FIG. 1H is a simplified side perspective view of a portion of the light source assembly 10 of FIG. 1A. In particular, FIG. 1H illustrates additional features of one or more of the plurality of disparate light sources 14. For example, FIG. 1H illustrates certain features that can be included as part of the second light source 14B.

In one embodiment, the design of the second light source 14B can be somewhat similar to that of the first light source 14A. For example, as illustrated in FIG. 1H, the second light source 14B can be a quantum cascade laser (QCL) that generates and/or emits a coherent, second output beam 26B (illustrated in FIG. 1A). More particularly, in one embodiment, the second light source 14B can include a Quantum Cascade (QC) gain medium 34 that directly emits a light beam, i.e. the second output beam 26A, that is in the mid-wavelength infrared range. With this design, electrons transmitted through the QC gain medium 34 emit one photon at each of the energy steps. For example, the QC gain medium 34 can use two different semiconductor materials such as InGaAs and AlInAs (grown on an InP or GaSb substrate, for example) to form a series of potential wells and barriers for electron transitions. The thickness of these wells/barriers determines the wavelength characteristic of the QC gain medium 34. Additionally, in one, non-exclusive such embodiment, the semiconductor QCL laser chip is mounted epitaxial growth side down. Alternatively, the second light source 14B can include an interband-cascade (IC) laser, a diode laser, and/or any other laser capable of generating radiation in the appropriate mid-wavelength infrared spectral region.

FIG. 1H further illustrates certain aspects of one non-exclusive embodiment of the optical assembly 16. For example, as related to the second light source 14B, the optical assembly 16 can be positioned substantially adjacent to the QC gain medium 34 in line with the lasing axis. In certain embodiments, the optical assembly 16 can include one lens or more than one lens that collimate and focus the light or can spread the light to provide other beam shapes such as top hat, doughnut, spherical configurations after the beam exits the facet of the QC gain medium 34. In one such embodiment, the optical assembly 16 can include an aspherical lens having an optical axis that is aligned with the lasing axis. Alternatively, the optical assembly 16 can have a different design relative to the second light source 14B. Still alternatively, as noted above, the second light source 14B can be provided without the optical assembly 16, and/or with the optical assembly 16 simply including a window, such that the second output beam 26B is uncollimated.

It should be noted that in certain embodiments, the light sources 14A-14E and/or the optical assembly 16 can be positioned such that the light source assembly 10 can provide as much as a fully spherical optical output.

Figure 2A:
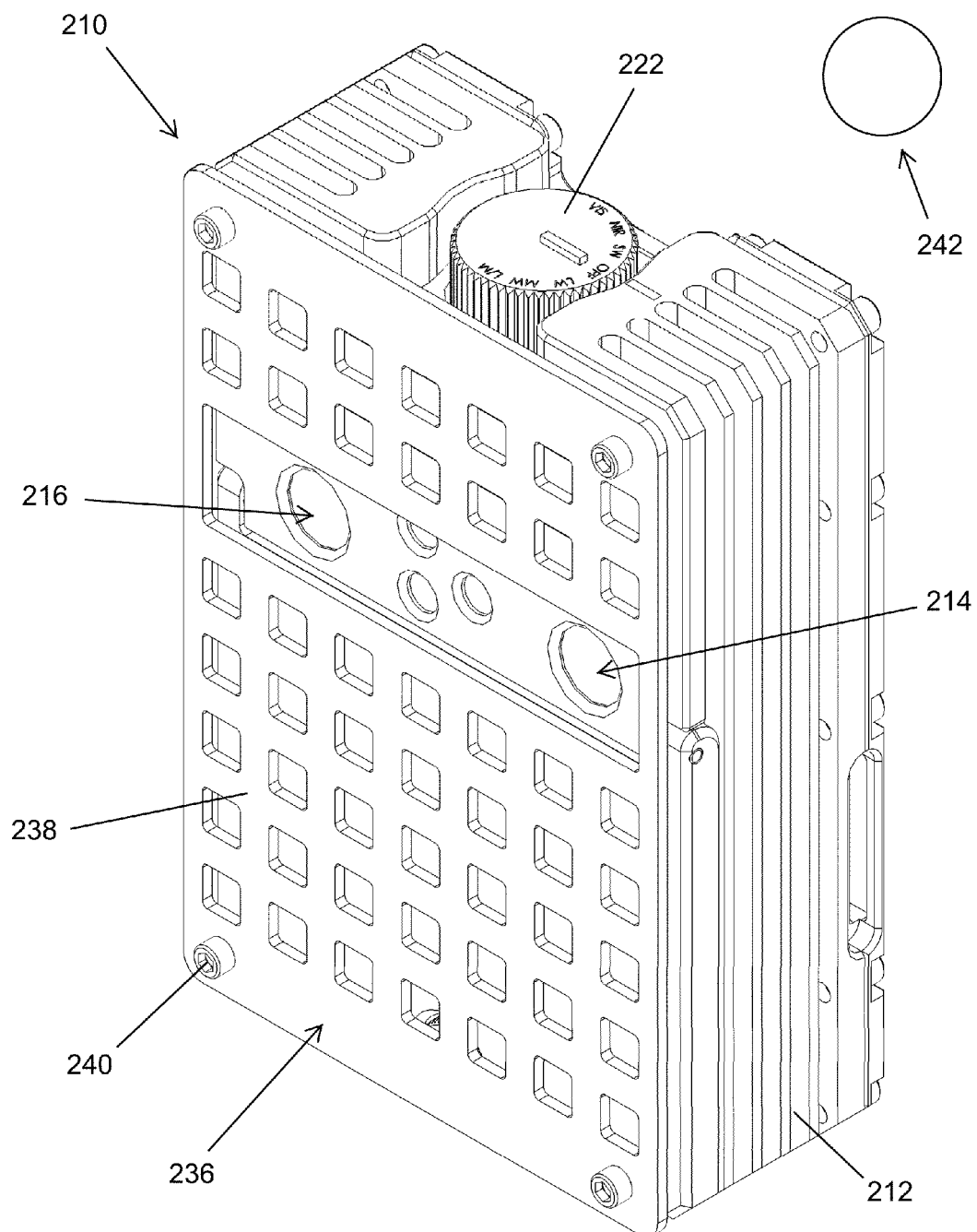
FIG. 2A is a simplified front perspective view of another embodiment of a light source assembly having features of the present invention.

FIG. 2A is a simplified front perspective view of another embodiment of a light source assembly 210 having features of the present invention. The light source assembly 210 illustrated in FIG. 2A is substantially similar to the light source assembly 10 illustrated and described herein in relation to FIGS. 1A-1H. For example, the light source assembly 210 can include a housing assembly 212, a plurality of disparate light sources 214, an optical assembly 216, a control assembly (not illustrated), a power source (not illustrated), and a selector assembly 222 that are substantially similar to the housing assembly 12, the plurality of disparate light sources 14, the optical assembly 16, the control assembly 18, the power source 20, and the selector assembly 22 illustrated and described herein in relation to FIGS. 1A-1H.

However, in this embodiment, the light source assembly 210 further includes a thermal shield 236, e.g., a solar shield, that can be positioned substantially adjacent to the housing assembly 212, e.g., substantially adjacent to the housing front (not shown) and the power compartment cover (not shown). For example, in one embodiment, the thermal shield 236 can include a shield body 238 that is coupled to the housing assembly 212, e.g., with a plurality of shield fasteners 240, such that the shield body 238 can be positioned spaced apart from the housing assembly 212. With this design, the thermal shield 236 functions to inhibit energy, e.g., heat, from contacting the housing assembly 212 and/or being conducted into the other components of the light source assembly 210.

The thermal shield 236 is designed to shield the remainder of the light source assembly 210 from absorbing excessive energy from an external energy source 242 (illustrated as a circle), e.g., the sun, by either dissipating, reflecting or simply absorbing the energy. The design of the thermal shield 236 can be varied depending on the specific requirements of the light source assembly 210. In certain embodiments, as shown in FIG. 2A, the shield body 238 can have a lattice-type design that effectively inhibits and/or blocks at least a majority of the energy, e.g., the solar rays, from hitting a percentage of the housing assembly 212. Additionally, the holes that are provided in the lattice-type design allow for natural convection cooling of the top surface of the housing assembly 212. Alternatively, the thermal shield 236, i.e. the shield body 238, can have a different design than that illustrated in FIG. 2A.

Figure 2B:
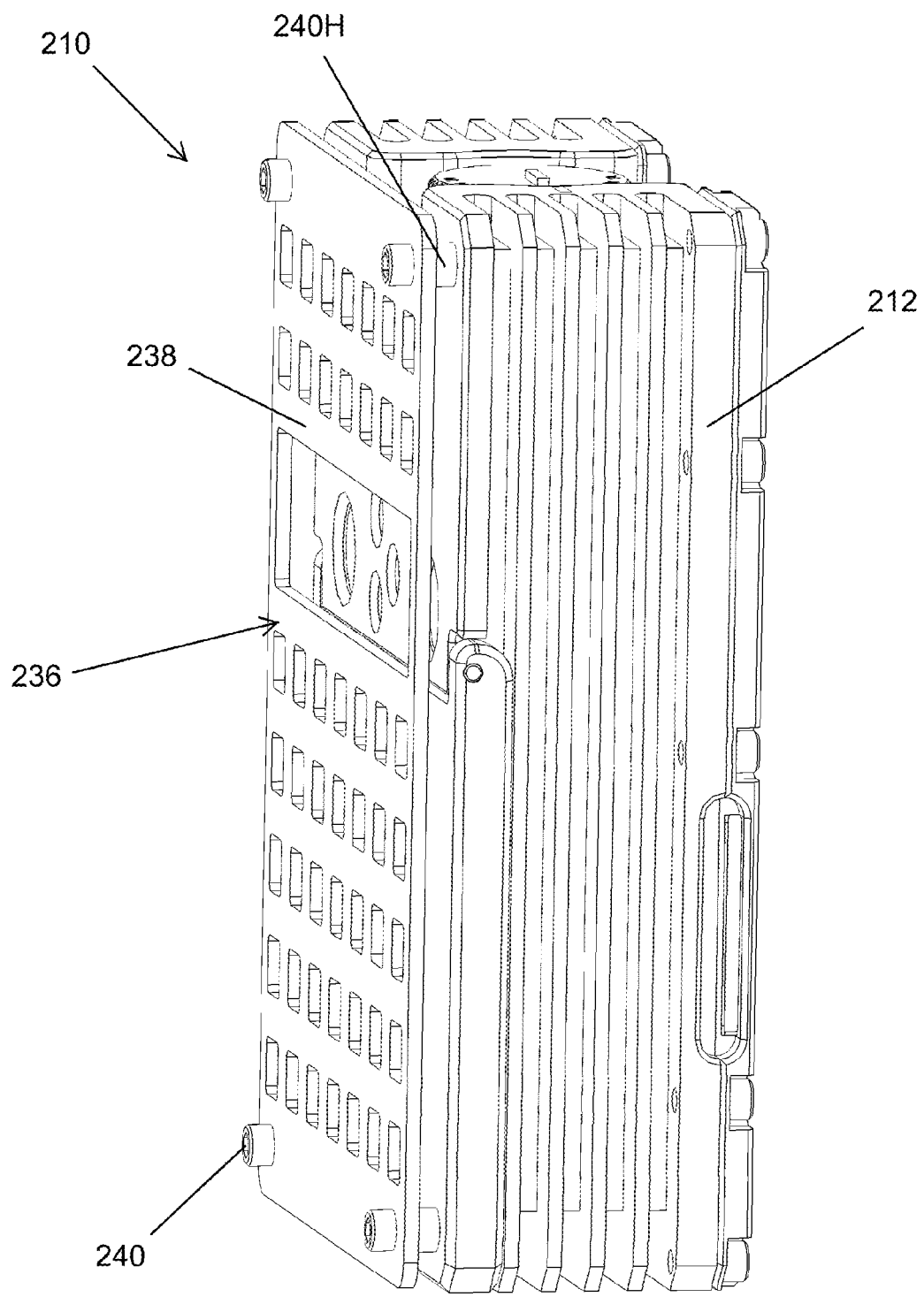
FIG. 2B is a simplified side perspective view of the light source assembly of FIG. 2A.

FIG. 2B is a simplified side perspective view of the light source assembly 210 of FIG. 2A. In particular, this side perspective view better illustrates how the shield body 238 of the thermal shield 236 can be coupled to and spaced apart from the housing assembly 212 of the light source assembly 210. For example, in some embodiments, each of the shield fasteners 240, e.g., screws, can extend within and/or through a fastener housing 240H that is positioned, at least in part, between the housing assembly 212 and the shield body 238. Thus, in such embodiments, the fastener housing 240H enables the shield body 238 to be maintained spaced apart from the housing assembly 212, while still enabling the fasteners to effectively couple the shield body 238 to the housing assembly 212.

Figure 2C:
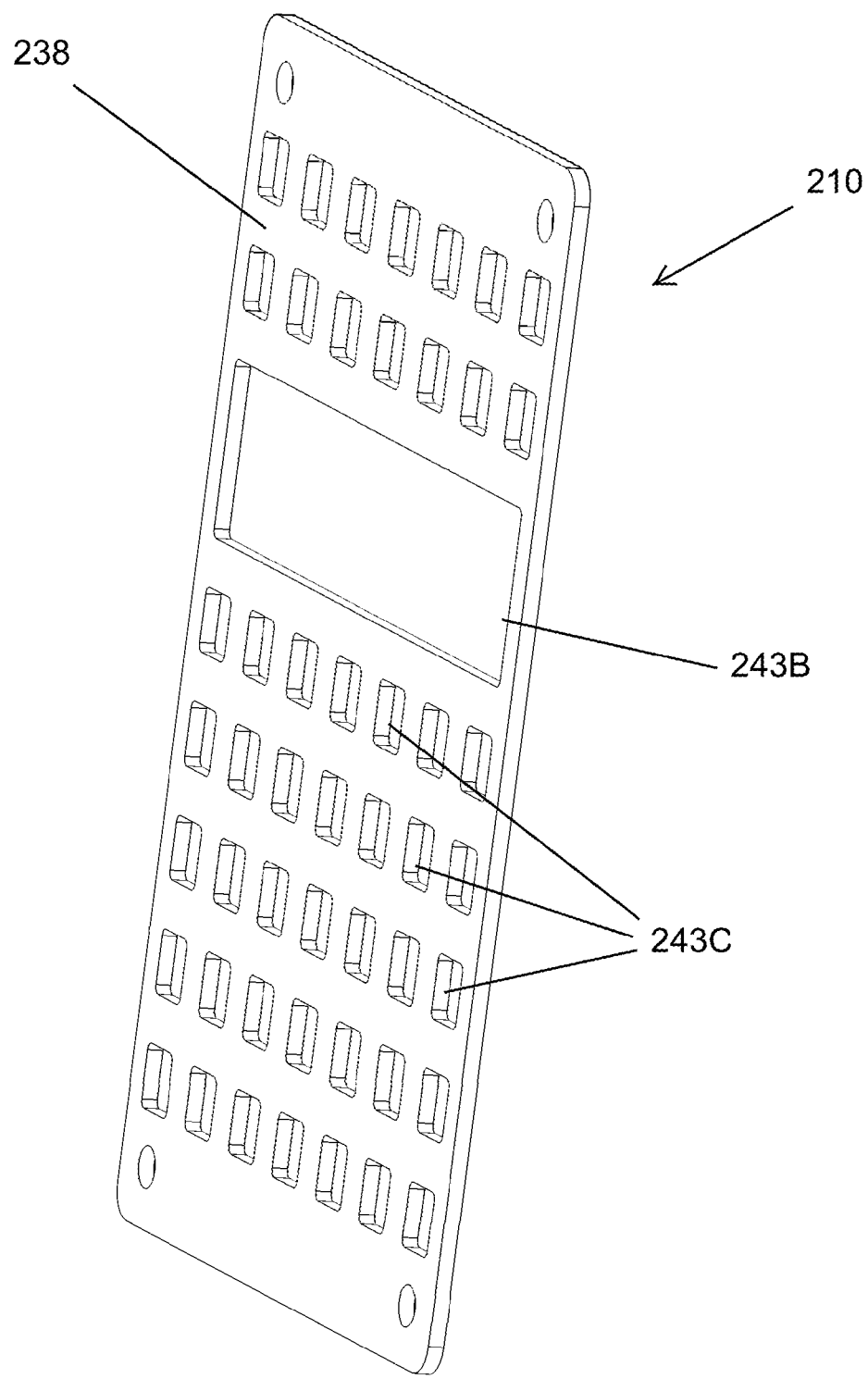
FIG. 2C is a front perspective view of a portion of the light source assembly of FIG. 2A.

FIG. 2C is a front perspective view of a portion of the light source assembly 210 of FIG. 2A. In particular, FIG. 2C illustrates a potential design for the shield body 238 that can be utilized to effectively inhibit and/or block a majority of the energy, e.g., the solar rays, from hitting the housing assembly 212 (illustrated in FIG. 2A), while still allowing for natural convection cooling of the top surface of the housing assembly 212. As shown, and as noted above, the shield body 238 can have a lattice-type design that enables such desirable features to be effectively accomplished.

In some embodiments, such as shown in FIG. 2C, the shield body 238 can include a plurality of cooling apertures 243C that can be sized and positioned to most effectively enable natural convection cooling of the full housing assembly 212. In certain non-exclusive alternative embodiments, the cooling apertures 243C can be substantially similar in size, can be evenly spaced apart from one another and can be sized to be positioned within between twenty percent and forty-five percent of the shield body 238. In one non-exclusive embodiment, the shield body 238 can include seven rows of cooling apertures 243C that each include seven individual cooling apertures 243C. Alternatively, the shield body 238 can include greater of fewer cooling apertures 243C than illustrated in FIG. 2C and/or the cooling apertures 243C can be positioned within greater than forty-five percent or less than twenty percent of the shield body 238.

Additionally, as shown, the shield body 238 can further include a beam aperture 243B that is positioned and sized to allow each of the output beams 26A-26E (illustrated in FIG. 1A) from each of the light sources 14A-14E (illustrated in FIG. 1A) to be directed away from the housing assembly 212 and through the beam aperture 243B. In one embodiment, as shown, the beam aperture 243B can be substantially rectangle-shaped. Alternatively, the beam aperture 243B can be another suitable shape.

Figure 3:
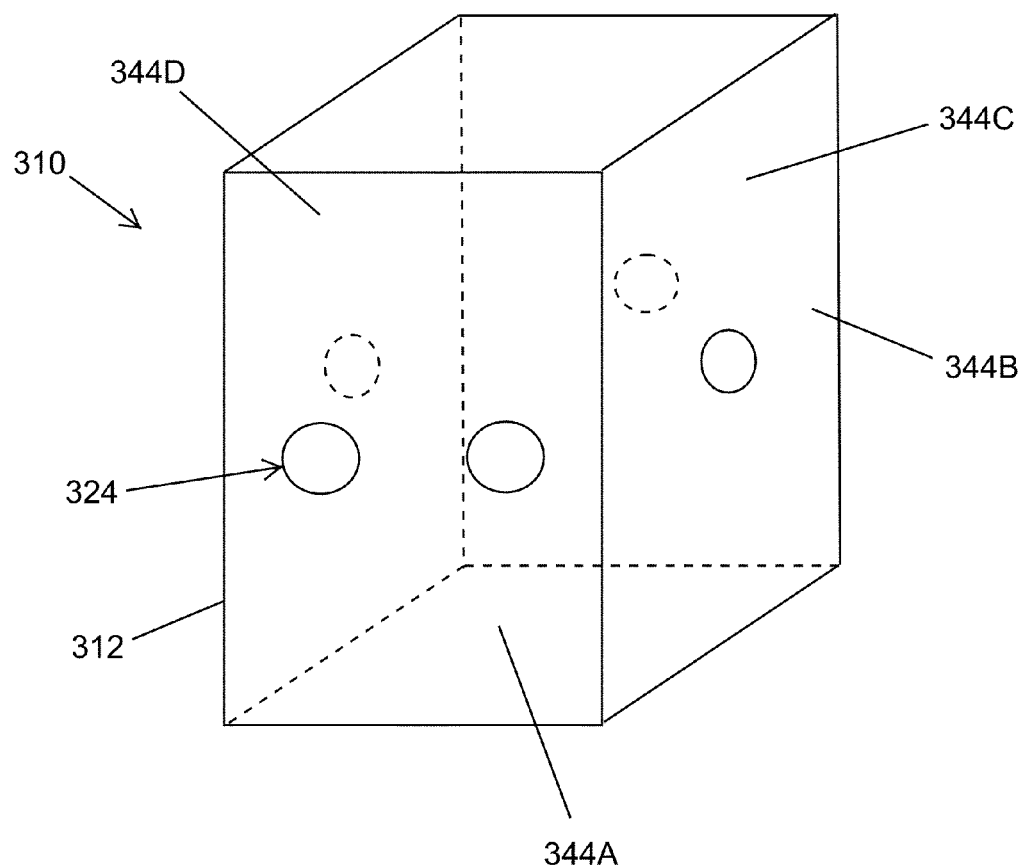
FIG. 3 is a simplified schematic front perspective view of a portion of still another embodiment of a light source assembly having features of the present invention.

FIG. 3 is a simplified schematic front perspective view of a portion of still another embodiment of a light source assembly 310 having features of the present invention. In particular, FIG. 3 provides a simplified front perspective view of another embodiment of the housing assembly 312, with the additional features of the light source assembly 310 having been omitted for purposes of clarity.

As noted above, in certain embodiments, the light source assembly 310 can be designed such that one or more of the output beams 26A-26E (illustrated in FIG. 1A) can be directed away from the housing assembly 312 at an angle relative to any of the other output beams 26A-26E, such that the output beams 26A-26E, and thus the beam axes 27A-27E (illustrated in FIG. 1A), are not parallel to one another. For example, in the non-exclusive alternative embodiment illustrated in FIG. 3, the housing assembly 312 can include a plurality of housing apertures 324, with one or more of the housing apertures 324 being potentially positioned along a front surface 344A, a first side surface 344B, a rear surface 344C and a second side surface 344D of the housing assembly 312. With this design, one or more of the output beams 26A-26E can be directed away from the housing assembly 312 through a different face of the housing assembly 312. For example, in one non-exclusive alternative arrangement, the first output beam 26A and the second output beam 26B can be directed away from the front surface 344A of the housing assembly 312, the third output beam 26C can be directed away from the first side surface 344B of the housing assembly 312, the fourth output beam 26D can be directed away from the rear surface 344C of the housing assembly 312, and the fifth output beam 26E can be directed away from the second side surface 344D of the housing assembly 312. Alternatively, the output beams 26A-26E can be directed away from the housing assembly 312 in a different manner. More specifically, it should be appreciated that in various alternative embodiments, each of the output beams 26A-26E can be directed away from the housing assembly 312 in any desired direction(s), away from any surface(s) 344A-344D of the housing assembly 12, and/or through any housing aperture(s) 324.

Figure 4A:
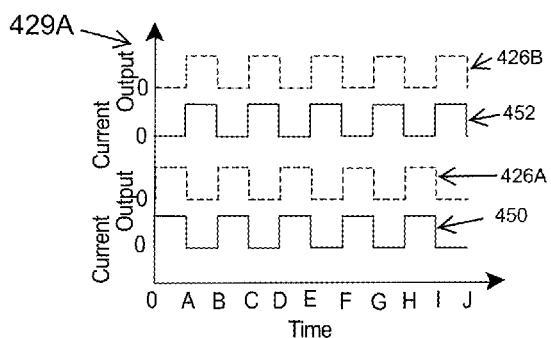
FIGS. 4A-4F are simplified graphical illustrations of current and output for various selector settings of the light source assembly of FIG. 1A.

FIGS. 4A-4F are simplified graphical illustrations of current and output for various potential selector settings of the light source assembly of FIG. 1A. In particular, FIG. 4A is a simplified graphical illustration of current (illustrated with a solid line) and output (illustrated with a dashed line) for a first selector setting 429A wherein a first output beam 26A (illustrated in FIG. 1A) from a long-wavelength infrared light source 14A (illustrated in FIG. 1A) and a second output beam 26B (illustrated in FIG. 1A) from a mid-wavelength infrared light source 14B (illustrated in FIG. 1A) are generated in a pulsed and alternating manner; FIG.

4B is a simplified graphical illustration of current (illustrated with a solid line) and output (illustrated with a dashed line) for a second selector setting 429B wherein a first output beam 26A from a long-wavelength infrared light source 14A is generated in a pulsed manner; FIG. 4C is a simplified graphical illustration of current (illustrated with a solid line) and output (illustrated with a dashed line) for a third selector setting 429C wherein a second output beam 26B from a mid-wavelength infrared light source 14B is generated in a pulsed manner; FIG. 4D is a simplified graphical illustration of current (illustrated with a solid line) and output (illustrated with a dashed line) for a fourth selector setting 429D wherein a third output beam 26C (illustrated in FIG. 1A) from a short-wavelength infrared light source 14C is generated in a pulsed manner; FIG. 4E is a simplified graphical illustration of current (illustrated with a solid line) and output (illustrated with a dashed line) for a fifth selector setting 429E wherein a fourth output beam 26D (illustrated in FIG. 1A) from a near-infrared light source 14D (illustrated in FIG. 1A) is generated in a pulsed manner; and FIG. 4F is a simplified graphical illustration of current (illustrated with a solid line) and output (illustrated with a dashed line) for a sixth selector setting 429F wherein a fifth output beam 26E (illustrated in FIG. 1A) from a visible light source 14E (illustrated in FIG. 1A) is generated in a pulsed manner.

With reference to FIG. 4A, at the first selector setting 429A, the control system 18 (illustrated in FIG. 1D) can selectively direct current from the power source 20 (illustrated in FIG. 1E) to the first light source 14A (illustrated in FIG. 1A) in a first duty cycle 450 to generate the first output beam 426A, and direct current from the power source 20 to the second light source 14B (illustrated in FIG. 1A) in a second duty cycle 452 that is different from the first duty cycle to generate the second output beam 426B. In particular, in this embodiment, the first duty cycle 450 consists of current being directed to the first light source 14A for a first predetermined period of time and current not being directed to the first light source 14A for a second predetermined period of time, wherein the first predetermined period of time is approximately equal in length to the second predetermined period of time. Conversely, in this embodiment, the second duty cycle 452 consists of current not being directed to the second light source 14B for the first predetermined period of time and current being directed to the second light source 14B for the second predetermined period of time. With this non-exclusive example, each of the first duty cycle 450 and the second duty cycle 452 is approximately fifty percent, e.g., with current being directed and not directed to the given light source 14A, 14B for a substantially equal period of time. Moreover, with this mode of operation, the first output beam 426A and the second output beam 426B can be generated and/or emitted from the light source assembly 10 in an alternating manner. Alternatively, each of the first duty cycle 450 and the second duty cycle 452 can be greater than or less than approximately fifty percent.

It should be noted that with the first selector setting 429A, (i) the first light source 14A and the second light source 14B are on at different times (pulsed non-simultaneously); and (ii) the first output beam 426A and the second output beam 426B are non-simultaneous. Further, for the first selector setting 429A illustrated in FIG. 4A, the first light source 14A and the second light source 14B are pulsed in one for one alternating fashion, with a single pulse of the first output beam 426A being generated between two pulses of the second output beam 426B. In non-exclusive other embodiments, the duty cycles can be designed so that during certain periods of time, (i) multiple pulses of the first output beam 426A are being generated between two pulses of the second output beam 426B; and/or (ii) multiple pulses of the second output beam 426B are being generated between two pulses of the first output beam 426A. This feature allows for the generation of messages using the pulses of the output beams 426A, 426B.

Figure 4B:
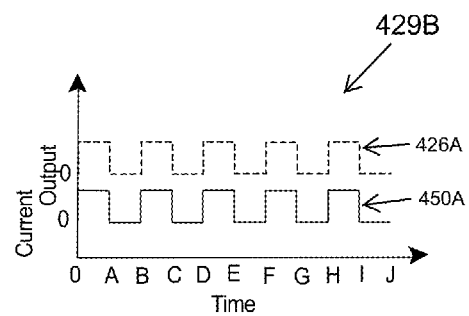
Figure 4C:
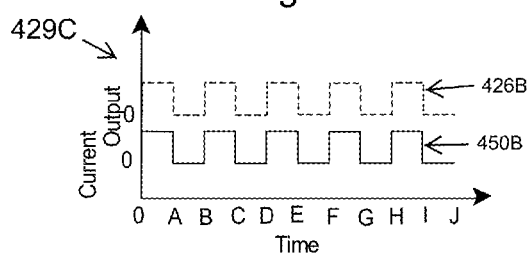
Figure 4D:
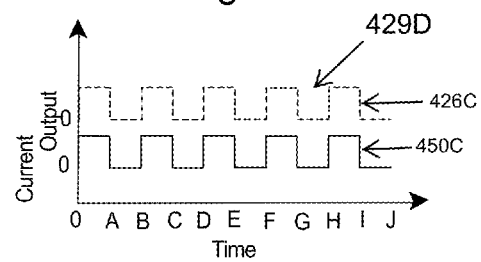
Figure 4E:
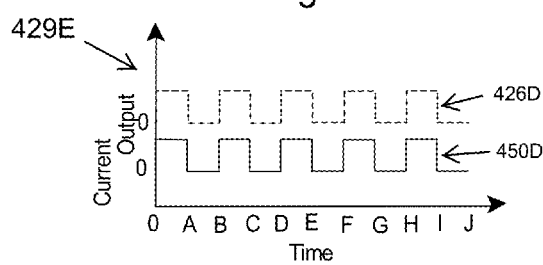
Figure 4F:
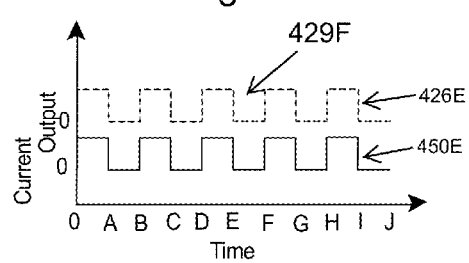

Additionally, as shown in FIG. 4B, at the second selector setting 429B, the control system 18 (illustrated in FIG. 1D) can selectively direct current from the power source 20 (illustrated in FIG. 1E) to the first light source 14A (illustrated in FIG. 1A) in the first duty cycle 450A to generate the first output beam 26A. In the non-exclusive embodiment illustrated in FIG. 4B, the duty cycle 450A is approximately fifty percent, e.g. the current is directed to the first light source 14A for a predetermined period of time and alternately the current is not directed to the first light source 14A for the same predetermined period. Alternatively, the duty cycle 450A can be greater than or less than fifty percent.

Somewhat similarly, as shown in FIG. 4C, at the third selector setting 429C, the control system 18 (illustrated in FIG. 1D) can selectively direct current from the power source 20 (illustrated in FIG. 1E) to the second light source 14B (illustrated in FIG. 1A) in a second duty cycle 450B to generate the second output beam 426B. In the non-exclusive embodiment illustrated in FIG. 4C, the duty cycle 450B is approximately fifty percent, e.g. the current is directed to the second light source 14B for a predetermined period of time and alternately the current is not directed to the second light source 14B for the same predetermined period. Alternatively, the duty cycle 450B can be greater than or less than fifty percent.

Further, as shown in FIG. 4D, at the fourth selector setting 429D, the control system 18 (illustrated in FIG. 1D) can selectively direct current from the power source 20 (illustrated in FIG. 1E) to the third light source 14C (illustrated in FIG. 1A) in a third duty cycle 450C to generate the third output beam 426C. In the non-exclusive embodiment illustrated in FIG. 4D, the third duty cycle 450C is approximately fifty percent, e.g. the current is directed to the third light source 14C for a predetermined period of time and alternately the current is not directed to the third light source 14C for the same predetermined period. Alternatively, the third duty cycle 450C can be greater than or less than fifty percent.

Still further, as shown in FIG. 4E, at the fifth selector setting 429E, the control system 18 (illustrated in FIG. 1D) can selectively direct current from the power source 20 (illustrated in FIG. 1E) to the fourth light source 14D (illustrated in FIG. 1A) in a fourth duty cycle 450D to generate the fourth output beam 426D. In the non-exclusive embodiment illustrated in FIG. 4E, the duty cycle 450D is approximately fifty percent, e.g. the current is directed to the fourth light source 14D for a predetermined period of time and alternately the current is not directed to the fourth light source 14D for the same predetermined period. Alternatively, the duty cycle 450D can be greater than or less than fifty percent.

Yet further, as shown in FIG. 4F, at the sixth selector setting 429F, the control system 18 (illustrated in FIG. 1D) can selectively direct current from the power source 20 (illustrated in FIG. 1E) to the fifth light source 14E (illustrated in FIG. 1A) in a fifth duty cycle 450E to generate the fifth output beam 426E. In the non-exclusive embodiment illustrated in FIG. 4F, the duty cycle 450E is approximately fifty percent, e.g. the current is directed to the fifth light source 14E for a predetermined period of time and alternately the current is not directed to the fifth light source 14E for the same predetermined period. Alternatively, the duty cycle 450E can be greater than or less than fifty percent.

It is understood that although a number of different embodiments of a light source assembly 10, 210, 310 have been illustrated and described herein, one or more features of any one embodiment can be combined with one or more features of one or more of the other embodiments, provided that such combination satisfies the intent of the present invention.

While a number of exemplary aspects and embodiments of a light source assembly 10, 210, 310 have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

What is claimed is:

1. A light source assembly for use by a user, the light source assembly comprising:
   a housing assembly;
   a first light source that is coupled to the housing assembly, the first light source generating a coherent, first output beam that is directed away from the housing assembly, the first output beam having a first center wavelength that is in a long-wavelength infrared range of between approximately eight and fifteen micrometers;
   a second light source that is coupled to the housing assembly, the second light source generating a coherent, second output beam that is directed away from the housing assembly, the second output beam having a second center wavelength that is in a mid-wavelength infrared range of between approximately three and eight micrometers;
   a power source that is coupled to the housing assembly, the power source providing electrical power for the first light source and the second light source;
   a control system that is coupled to the housing assembly, the control system selectively controlling the electrical power that is provided by the power source to the first light source and the second light source; and
   a selector assembly that is electrically connected to the control system, the selector assembly being selectively controllable by the user to select a first selector setting in which the control system directs pulses of current from the power source to the first light source in a first duty cycle, and directs pulses of current from the power source to the second light source in a second duty cycle;
   wherein the housing assembly includes a first housing aperture and a spaced apart second housing aperture, and wherein the first output beam is directed away from the housing assembly through the first housing aperture and the second output beam is directed away from the housing assembly through the second housing aperture.

2. The light source assembly of claim 1 wherein at least one of the first light source and the second light source includes a quantum cascade gain medium.

3. The light source assembly of claim 1 wherein the second duty cycle is different from the first duty cycle so that the first output beam and the second output beam are not on at the same time.

4. The light source assembly of claim 1 wherein the selector assembly is selectively controllable by the user to select a second selector setting in which the control system directs current from the power source to the first light source so that the first light source generates the first output beam, and wherein the selector assembly is selectively controllable by the user to select a third selector setting in which the control system directs current from the power source to the second light source so that the second light source generates the second output beam.

5. The light source assembly of claim 1 wherein a first peak power of the first output beam generated by the first light source is greater than approximately one watt, and wherein a second peak power of the second output beam generated by the second light source is greater than approximately one watt.

6. The light source assembly of claim 1 wherein each of the first output beam and the second output beam is an uncollimated beam.

7. The light source assembly of claim 1 wherein the first output beam is emitted along a first beam axis and the second output beam is emitted along a second beam axis, and wherein the first beam axis is spaced apart from and substantially parallel to the second beam axis.

8. The light source assembly of claim 1 further comprising a thermal shield that is coupled to the housing assembly, the thermal shield including a shield body that is spaced apart from the housing assembly, the shield body including a lattice-type design that inhibits energy external to the housing assembly from contacting the housing assembly, while allowing natural convection cooling of a surface of the housing assembly.

9. The light source assembly of claim 1 further comprising a third light source that is coupled to the housing assembly, the third light source generating a third output beam that is directed away from the housing assembly, the third output beam having a third center wavelength that is in a third wavelength range that is one of a short-wavelength infrared range of between approximately one point four and three micrometers, a near-infrared wavelength range of between approximately seven hundred fifty nanometers and one point four micrometers, and a visible wavelength range of between approximately three hundred eighty and seven hundred nanometers.

10. The light source assembly of claim 9 wherein the housing assembly includes a third housing aperture that is spaced apart from the first housing aperture and the second housing aperture; and wherein the third output beam is directed away from the housing assembly through the third housing aperture.

11. The light source assembly of claim 9 wherein at least one of the first light source, the second light source and the third light source includes a quantum cascade gain medium.

12. The light source assembly of claim 9 wherein each of the first output beam, the second output beam and the third output beam is an uncollimated beam.

13. The light source assembly of claim 9 wherein the selector assembly is selectively controllable by the user to select (i) the first selector setting in which the control system directs pulses of current from the power source to the first light source in the first duty cycle, and directs pulses of current from the power source to the second light source in the second duty cycle that is different from the first duty cycle so that the first output beam and the second output beam are pulsed in a non-simultaneous manner, (ii) a second selector setting in which the control system directs current from the power source to the first light source so that the first light source generates the first output beam, (iii) a third selector setting in which the control system directs current from the power source to the second light source so that the second light source generates the second output beam, and (iv) a fourth selector setting in which the control system directs current from the power source to the third light source so that the third light source generates the third output beam.

14. The light source assembly of claim 9 further comprising a fourth light source that is coupled to the housing assembly, the fourth light source generating a fourth output beam that is directed away from the housing assembly, the fourth output beam having a fourth center wavelength that is in a fourth wavelength range that is different than the third wavelength range, the fourth wavelength range being one of (i) a short-wavelength infrared range of between approximately one point four and three micrometers, (ii) a near-infrared wavelength range of between approximately seven hundred fifty nanometers and one point four micrometers, and (iii) a visible wavelength range of between approximately three hundred eighty and seven hundred nanometers.

15. A light source assembly for use by a user, the light source assembly comprising:
- a housing assembly;
- a first light source that is coupled to the housing assembly, the first light source generating a coherent, first output beam that is directed away from the housing assembly, the first output beam having a first center wavelength that is in a long-wavelength infrared range of between approximately eight and fifteen micrometers;
- a second light source that is coupled to the housing assembly, the second laser source generating a coherent, second output beam that is directed away from the housing assembly, the second output beam having a second center wavelength that is in a mid-wavelength infrared range of between approximately three and eight micrometers;
- a third light source that is coupled to the housing assembly, the third light source generating a third output beam that is directed away from the housing assembly, the third output beam having a third center wavelength that is in a third wavelength range that is one of a short-wavelength infrared range of between approximately one point four and three micrometers, a near-infrared wavelength range of between approximately seven hundred fifty nanometers and one point four micrometers, and a visible wavelength range of between approximately three hundred eighty and seven hundred nanometers;
- a fourth light source that is coupled to the housing assembly, the fourth light source generating a fourth output beam that is directed away from the housing assembly, the fourth output beam having a fourth center wavelength that is in a fourth wavelength range that is different than the third wavelength range, the fourth wavelength range being one of (i) a short-wavelength infrared range of between approximately one point four and three micrometers, (ii) a near-infrared wavelength range of between approximately seven hundred fifty nanometers and one point four micrometers, and (iii) a visible wavelength range of between approximately three hundred eighty and seven hundred nanometers;
- a power source that is coupled to the housing assembly, the power source providing electrical power for the first light source, the second light source, the third light source, and the fourth light source;
- a control system that is coupled to the housing assembly, the control system selectively controlling the electrical power that is provided by the power source to the first light source, the second light source, the third light source, and the fourth light source; and
- a selector assembly that is electrically connected to the control system, the selector assembly being selectively controllable by the user to select a first selector setting in which the control system directs pulses of current from the power source to the first light source in a first duty cycle, and directs pulses of current from the power source to the second light source in a second duty cycle.

16. The light source assembly of claim 15 wherein the housing assembly includes a first housing aperture, a second housing aperture that is spaced apart from the first housing aperture, a third housing aperture that is spaced apart from the first housing aperture and the second housing aperture, and a fourth housing aperture that is spaced apart from the first housing aperture, the second housing aperture and the third housing aperture; and wherein the first output beam is directed away from the housing assembly through the first housing aperture, the second output beam is directed away from the housing assembly through the second housing aperture, the third output beam is directed away from the housing assembly through the third housing aperture, and the fourth output beam is directed away from the housing assembly through the fourth housing aperture.

17. The light source assembly of claim 15 wherein the selector assembly is selectively controllable by the user to select (i) the first selector setting in which the control system directs pulses of current from the power source to the first light source in the first duty cycle, and directs pulses of current from the power source to the second light source in the second duty cycle that is different from the first duty cycle so that the first output beam and the second output beam are pulsed in a non-simultaneous manner, (ii) a second selector setting in which the control system directs current from the power source to the first light source so that the first light source generates the first output beam, (iii) a third selector setting in which the control system directs current from the power source to the second light source so that the second light source generates the second output beam, (iv) a fourth selector setting in which the control system directs current from the power source to the third light source so that the third light source generates the third output beam, and (v) a fifth selector setting in which the control system directs current from the power source to the fourth light source so that the fourth light source generates the fourth output beam.

18. The light source assembly of claim 15 further comprising a fifth light source that is coupled to the housing assembly, the fifth light source generating a fifth output beam that is directed away from the housing assembly, the fifth output beam having a fifth center wavelength that is in a fifth wavelength range that is different than the third wavelength range and the fourth wavelength range, the fifth wavelength range being one of (i) a short-wavelength infrared range of between approximately one point four and three micrometers, (ii) a near-infrared wavelength range of between approximately seven hundred fifty nanometers and one point four micrometers, and (iii) a visible wavelength range of between approximately three hundred eighty and seven hundred nanometers.

19. The light source assembly of claim 18 wherein the housing assembly includes a first housing aperture, a second housing aperture that is spaced apart from the first housing aperture, a third housing aperture that is spaced apart from the first housing aperture and the second housing aperture, a fourth housing aperture that is spaced apart from the first housing aperture, the second housing aperture and the third housing aperture, and a fifth housing aperture that is spaced apart from the first housing aperture, the second housing aperture, the third housing aperture and the fourth housing aperture; and wherein the first output beam is directed away from the housing assembly through the first housing aperture, the second output beam is directed away from the housing assembly through the second housing aperture, the third output beam is directed away from the housing assembly through the third housing aperture, the fourth output beam is directed away from the housing assembly through the fourth housing aperture, and the fifth output beam that is directed away from the housing assembly through the fifth housing aperture.

20. The light source assembly of claim 18 wherein the selector assembly is selectively controllable by the user to select (i) the first selector setting in which the control system directs pulses of current from the power source to the first light source in the first duty cycle, and directs pulses of current from the power source to the second light source in the second duty cycle that is different from the first duty cycle so that the first output beam and the second output beam are pulsed in a non-simultaneous manner, (ii) a second selector setting in which the control system directs current from the power source to the first light source so that the first light source generates the first output beam, (iii) a third selector setting in which the control system directs current from the power source to the second light source so that the second light source generates the second output beam, (iv) a fourth selector setting in which the control system directs current from the power source to the third light source so that the third light source generates the third output beam, (v) a fifth selector setting in which the control system directs current from the power source to the fourth light source so that the fourth light source generates the fourth output beam, and (vi) a sixth selector setting in which the control system directs current from the power source to the fifth light source so that the fifth light source generates the fifth output beam.

21. The light source assembly of claim 15 wherein the selector assembly is selectively controllable by the user to select (i) a second selector setting in which the control system directs current from the power source to the first light source so that the first light source generates the first output beam, (ii) a third selector setting in which the control system directs current from the power source to the second light source so that the second light source generates the second output beam, (iii) a fourth selector setting in which the control system directs current from the power source to the third light source so that the third light source generates the third output beam, (iv) a fifth selector setting in which the control system directs current from the power source to the fourth light source so that the fourth light source generates the fourth output beam, and (v) a sixth selector setting in which the control system directs current from the power source to the fifth light source so that the fifth light source generates the fifth output beam.

22. A light source assembly for use by a user, the light source assembly comprising:
  a housing assembly;
  a first light source that is coupled to the housing assembly, the first light source generating a coherent, first output beam that is directed away from the housing assembly, the first output beam having a first center wavelength that is in a long-wavelength infrared range of between approximately eight and fifteen micrometers;
  a second light source that is coupled to the housing assembly, the second light source generating a coherent, second output beam that is directed away from the housing assembly, the second output beam having a second center wavelength that is in a mid-wavelength infrared range of between approximately three and eight micrometers;
  a power source that is coupled to the housing assembly, the power source providing electrical power for the first laser source and the second laser source;
  a control system that is coupled to the housing assembly, the control system selectively controlling the electrical power that is provided by the power source to the first light source and the second light source;
  a selector assembly that is electrically connected to the control system, the selector assembly being selectively controllable by the user to select a first selector setting in which the control system directs pulses of current from the power source to the first light source in a first duty cycle, and directs pulses of current from the power source to the second light source in a second duty cycle; and
  a thermal shield that is coupled to the housing assembly, the thermal shield including a shield body that is spaced apart from the housing assembly, the shield body including a lattice-type design that inhibits energy external to the housing assembly from contacting the housing assembly, while allowing natural convection cooling of a surface of the housing assembly.

* * * * *